(12) United States Patent
Chen et al.

(10) Patent No.: US 11,018,069 B2
(45) Date of Patent: May 25, 2021

(54) UNDERFILL CONTROL STRUCTURES AND METHOD

(71) Applicant: Taiwan Semiconductor Manufacturing Company, Ltd., Hsinchu (TW)

(72) Inventors: Ying-Ju Chen, Tuku Township (TW); An-Jhih Su, Taoyuan (TW); Hsien-Wei Chen, Hsinchu (TW); Der-Chyang Yeh, Hsinchu (TW); Chi-Hsi Wu, Hsinchu (TW); Chen-Hua Yu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/570,572

(22) Filed: Sep. 13, 2019

(65) Prior Publication Data

US 2020/0006179 A1    Jan. 2, 2020

Related U.S. Application Data

(62) Division of application No. 15/837,452, filed on Dec. 11, 2017, now Pat. No. 10,515,865, which is a (Continued)

(51) Int. Cl.
*H01L 23/31* (2006.01)
*H01L 21/48* (2006.01)
(Continued)

(52) U.S. Cl.
CPC ...... *H01L 23/3128* (2013.01); *H01L 21/4846* (2013.01); *H01L 21/563* (2013.01);
(Continued)

(58) Field of Classification Search
CPC ............. H01L 23/3128; H01L 21/4846; H01L 23/5226; H01L 23/5383; H01L 23/5389;
(Continued)

(56) References Cited

U.S. PATENT DOCUMENTS

| 6,048,656 A | 4/2000 | Akram et al. |
| 6,291,264 B1 | 9/2001 | Tang et al. |

(Continued)

FOREIGN PATENT DOCUMENTS

| CN | 101166394 A | 4/2008 |
| CN | 103779283 A | 5/2014 |
| CN | 1851912 A | 10/2016 |

*Primary Examiner* — Thinh T Nguyen
(74) *Attorney, Agent, or Firm* — Slater Matsil, LLP

(57) ABSTRACT

A semiconductor device and method of reducing the risk of underbump metallization poisoning from the application of underfill material is provided. In an embodiment a spacer is located between a first underbump metallization and a second underbump metallization. When an underfill material is dispensed between the first underbump metallization and the second underbump metallization, the spacer prevents the underfill material from creeping towards the second underbump metallization. In another embodiment a passivation layer is used to inhibit the flow of underfill material as the underfill material is being dispensed.

20 Claims, 18 Drawing Sheets

Related U.S. Application Data division of application No. 15/058,699, filed on Mar. 2, 2016, now Pat. No. 9,842,788.

(60) Provisional application No. 62/273,738, filed on Dec. 31, 2015.

(51) Int. Cl.
| | | |
|---|---|---|
| *H01L 23/538* | (2006.01) | |
| *H01L 23/00* | (2006.01) | |
| *H01L 21/56* | (2006.01) | |
| *H01L 23/522* | (2006.01) | |
| *H01L 23/498* | (2006.01) | |

(52) U.S. Cl.
CPC ...... *H01L 23/5226* (2013.01); *H01L 23/5383* (2013.01); *H01L 23/5389* (2013.01); *H01L 24/11* (2013.01); *H01L 24/14* (2013.01); *H01L 24/19* (2013.01); *H01L 23/49816* (2013.01); *H01L 2224/0401* (2013.01); *H01L 2224/04105* (2013.01); *H01L 2224/12105* (2013.01); *H01L 2224/26145* (2013.01); *H01L 2224/32225* (2013.01); *H01L 2224/73267* (2013.01); *H01L 2924/01029* (2013.01); *H01L 2924/01078* (2013.01); *H01L 2924/14* (2013.01); *H01L 2924/19104* (2013.01)

(58) Field of Classification Search
CPC ......... H01L 24/11; H01L 24/14; H01L 24/19; H01L 21/563
USPC ......... 257/737, 734, 738, 759; 438/108, 109
See application file for complete search history.

(56) References Cited

U.S. PATENT DOCUMENTS

| | | | |
|---|---|---|---|
| 8,399,305 | B2 | 3/2013 | Huang et al. |
| 9,607,967 | B1* | 3/2017 | Shih .................... H01L 25/0657 |
| 2002/0028533 | A1 | 3/2002 | Tang et al. |
| 2004/0145051 | A1* | 7/2004 | Klein et al. ......... H01L 25/0652 |
| | | | 257/734 |
| 2005/0195582 | A1 | 9/2005 | Landeros et al. |
| 2006/0046352 | A1 | 3/2006 | Low et al. |
| 2008/0099911 | A1 | 5/2008 | Machida |
| 2008/0237895 | A1 | 10/2008 | Saeki |
| 2011/0115083 | A1 | 5/2011 | Zang et al. |
| 2012/0068353 | A1 | 3/2012 | Huang |
| 2012/0193789 | A1 | 8/2012 | Hu et al. |
| 2012/0280374 | A1* | 11/2012 | Choi et al. ............... H01L 23/34 |
| | | | 257/659 |
| 2014/0042643 | A1* | 2/2014 | Yu et al. ............... H01L 23/585 |
| | | | 257/777 |
| 2014/0110836 | A1 | 4/2014 | Tsai et al. |
| 2014/0160688 | A1 | 6/2014 | Lu et al. |
| 2017/0194226 | A1 | 7/2017 | Chen et al. |

* cited by examiner

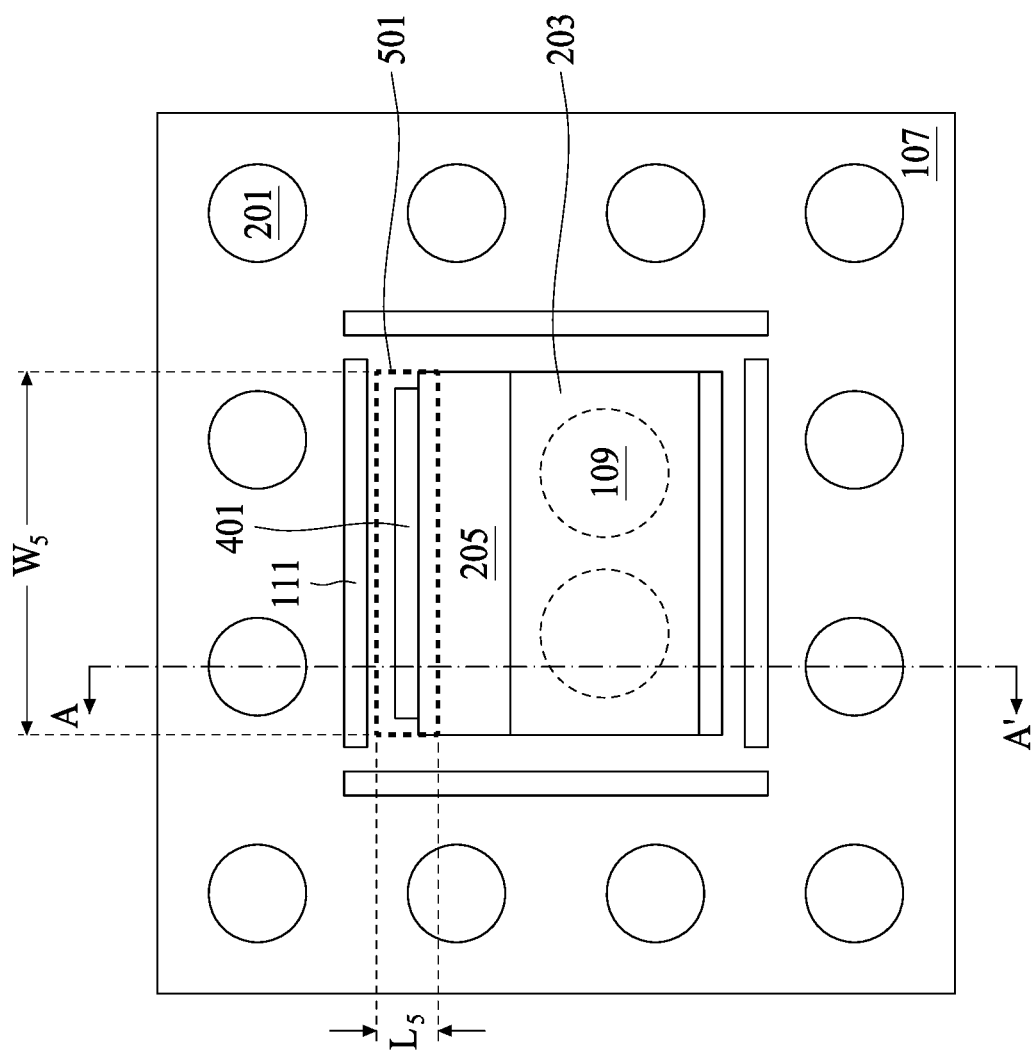

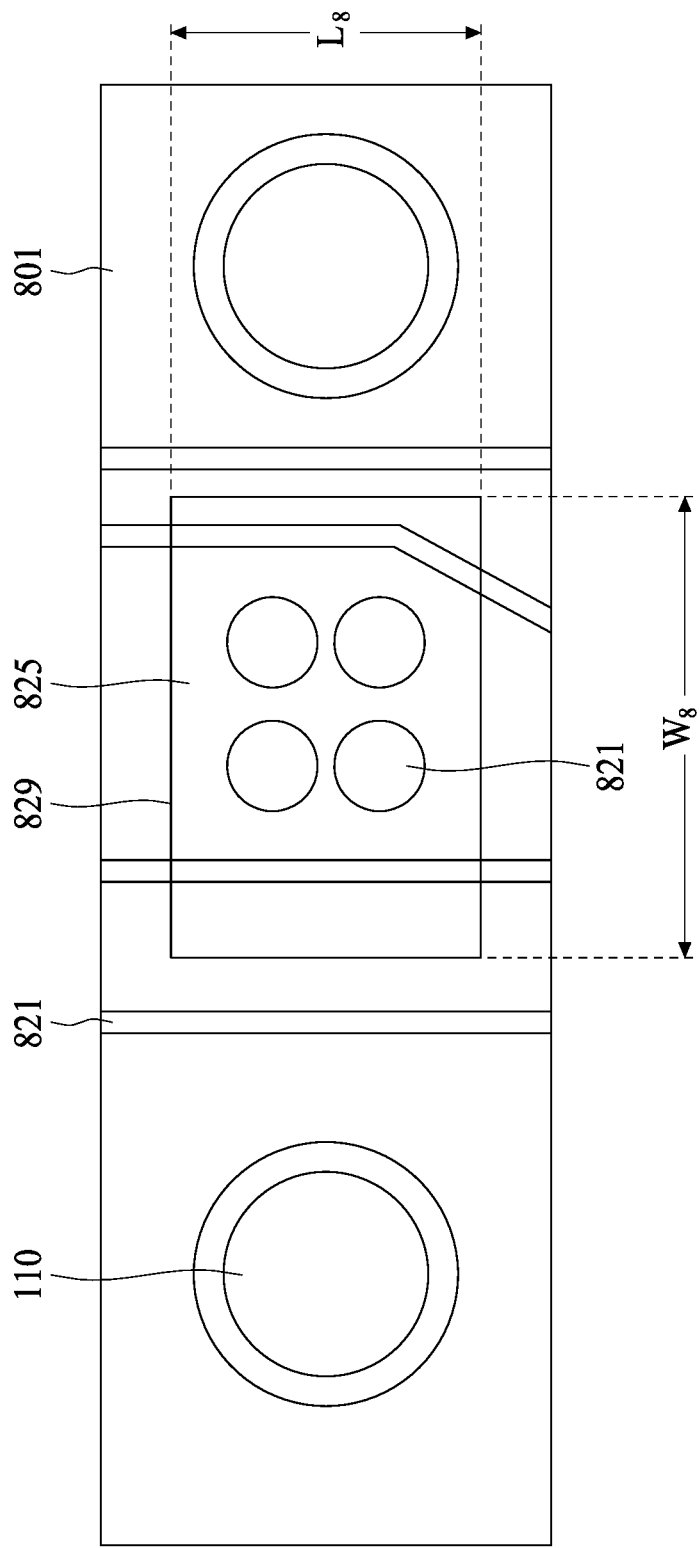

UNDERFILL CONTROL STRUCTURES AND METHOD

PRIORITY CLAIM AND CROSS-REFERENCE

This application is division of U.S. application Ser. No. 15/837,452, filed on Dec. 11, 2017, which is a divisional of U.S. application Ser. No. 15/058,699, filed on Mar. 2, 2016, which claims priority to U.S. Provisional Application No. 62/273,738, filed on Dec. 31, 2015, which applications are incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing various insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components use smaller and more advanced packaging systems than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5B illustrate a contact pad utilized in conjunction with the first trench in accordance with some embodiments.

FIGS. 8A-8B illustrate a formation of a passivation layer in accordance with some embodiments.

DETAILED DESCRIPTION

Figure 1A:
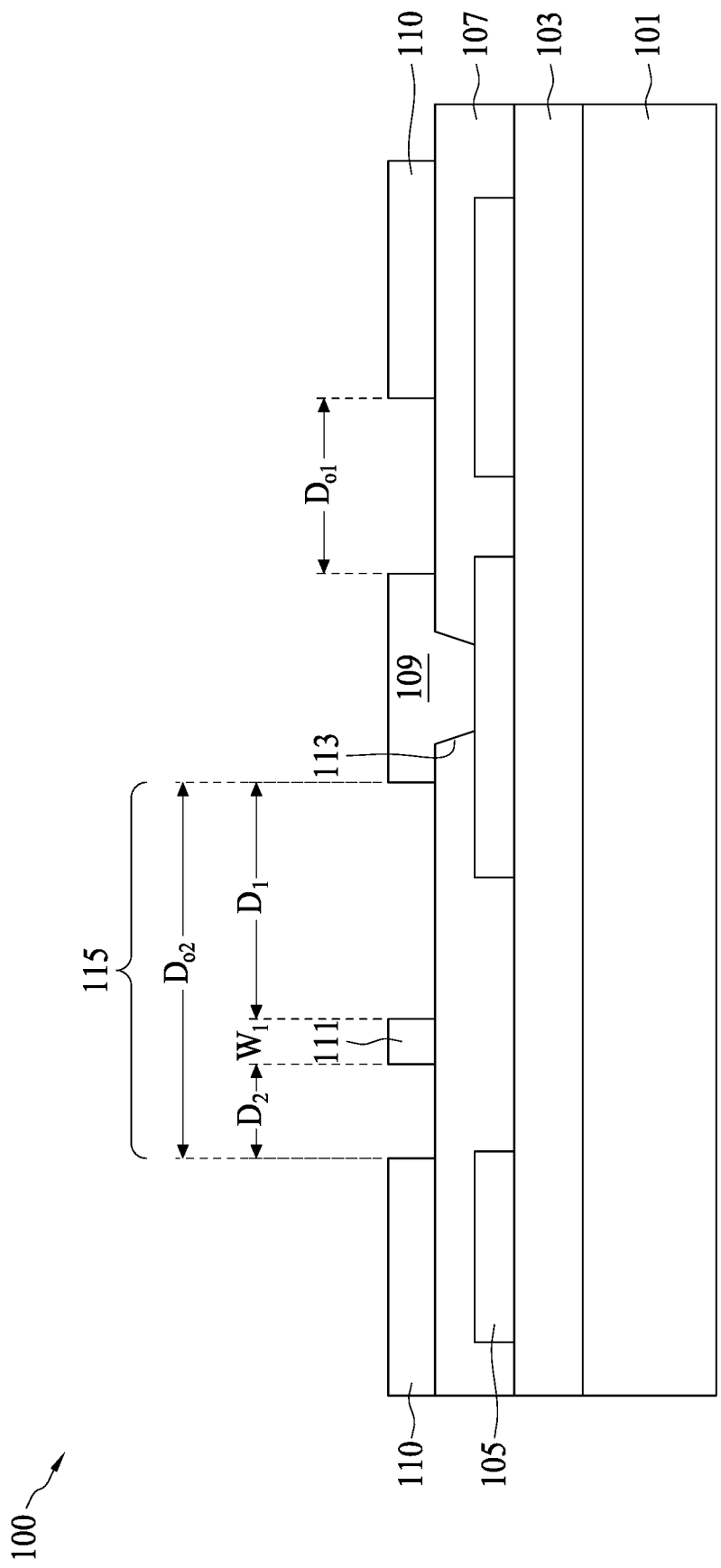
FIGS. 1A-1B illustrate a first spacer as part of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With respect to FIG. 1, there is illustrated a semiconductor device 100 with a substrate 101, active devices (not separately illustrated in FIG. 1), metallization layers 103, contact pads 105, a first passivation layer 107, a surface device underbump metallization 109, first external connection underbump metallizations 110, and a first spacer 111. In an embodiment the substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices may comprise a wide variety of active devices such as transistors and the like and passive devices such as capacitors, resistors, inductors and the like that may be used to generate the desired structural and functional parts of the design. The active devices and passive devices may be formed using any suitable methods either within or else on the substrate 101.

The metallization layers 103 are formed over the substrate 101 and the active devices and are designed to connect the various active devices to form functional circuitry for the design. In an embodiment the metallization layers are formed of alternating layers of dielectric and conductive material and may be formed through any suitable process (such as deposition, damascene, dual damascene, etc.). In an embodiment there may be one to four layers of metallization separated from the substrate 101 by at least one interlayer dielectric layer (ILD), but the precise number of metallization layers is dependent upon the design.

The contact pads 105 may be formed over and in electrical contact with the metallization layers 103. The contact pads 105 may comprise aluminum, but other materials, such as copper, may alternatively be used. The contact pads 105 may be formed using a deposition process, such as sputtering, to form a layer of material (not separately shown in FIG. 1A) and portions of the layer of material may then be removed through a suitable process (such as photolithographic masking and etching) to form the contact pads 105. However, any other suitable process may be utilized to form the contact pads 105. The contact pads 105 may be formed to have a thickness of between about 0.5 μm and about 4 μm, such as about 1.45 μm.

The first passivation layer 107 may be formed on the substrate 101 over the metallization layers 103 and the contact pads 105. The first passivation layer 107 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 107 may be formed through a process such as chemical vapor deposition (CVD), although any suitable process may be utilized, and may have a thickness between about 0.5 μm and about 5 μm, such as about 9.25 KÅ.

After the first passivation layer 107 has been formed, a first opening 113 may be made through the first passivation layer 107 by removing portions of the first passivation layer 107 to expose at least a portion of at least one of the underlying contact pads 105. The first opening 113 allows for contact between the contact pads 105 and the surface device underbump metallizations 109 and first external connection underbump metallizations 110. The first opening 113 may be formed using a suitable photolithographic mask and etching process, although any suitable process to expose portions of the contact pads 105 may be used.

The surface device underbump metallizations 109 and the first external connection underbump metallizations 110 may be formed in electrical contact with the contact pads 105. The surface device underbump metallizations 109 and the first external connection underbump metallizations 110 each may comprise a single layer of conductive material, such as a layer of titanium, or a layer of nickel. Alternatively, the surface device underbump metallizations 109 and the first external connection underbump metallizations 110 may comprise multiple sub-layers, not shown. One of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the surface device underbump metallizations 109 and the first external connection underbump metallizations 110, and that the surface device underbump metallizations 109 and the first external connection underbump metallizations 110 may be formed either simultaneously with each other or else in separate processes from each other. Any suitable materials or layers of material that may be used for the surface device underbump metallizations 109 and the first external connection underbump metallizations 110 are fully intended to be included within the scope of the current embodiments. The surface device underbump metallizations 109 and the first external connection underbump metallizations 110 may be created using processes such as sputtering, evaporation, or PECVD process, depending upon the desired materials. The surface device underbump metallizations 109 and the first external connection underbump metallizations 110 may be formed to have a thickness of between about 0.7 μm and about 10 μm, such as about 5 μm.

Additionally, the surface device underbump metallization 109 may be offset from an adjacent one of the first external connection underbump metallizations 110 by a first offset distance $D_{o1}$ of between about 50 μm and about 300 μm, such as about 150 μm. Additionally, the surface device underbump metallization 109 may be offset from a second one of the adjacent first external connections underbump metallizations 110 by a second offset distance $D_{o2}$ that is larger than the first offset distance $D_{o1}$ in order to provide space for a dispensing of underfill material 205 (described further below with respect to FIGS. 2A-2B). As such, the second offset distance $D_{o2}$ may extend over an underfill material dispensing region 115 and may be between about 50 μm and about 500 μm, such as about 350 μm. However, any suitable distance may be utilized.

Additionally, FIG. 1 also illustrates the formation of the first spacer 111 within the underfill material dispensing region 115 and between the surface device underbump metallization 109 and one of the first external connection underbump metallizations 110. In an embodiment the first spacer 111 may be formed from the same materials and using the same processes as the surface device underbump metallizations 109 and the first external connection underbump metallizations 110, although in some embodiments the first spacer 111 will not receive an external connection to electrically connect it to an external device. In a particular embodiment the first spacer 111 is formed simultaneously with the surface device underbump metallizations 109 and the first external connection underbump metallizations 110, although it may be formed separately. For example, the first spacer 111 may be formed of a material such as a layer of titanium, or a layer of nickel, and may be formed using sputtering or PECVD. However, other suitable materials, such as dielectric materials, and other suitable processes, may be used to provide a barrier to undesired creeping of the underfill material 205.

In an embodiment the first spacer 111 may be formed to have a first width $W_1$ of between about 2 μm and about 100 μm, such as about 10 μm. Additionally, the first spacer 111 may be located a first distance $D_1$ away from the surface device underbump metallization 109 of between about 10 μm and about 100 μm, such as about 50 μm. Also, the first spacer 111 may be located a second distance $D_2$ away from an adjacent first external connection underbump metallization 110 of between about 2 μm and about 100 μm, such as about 40 μm. However, any suitable distance may be utilized.

Figure 1B:
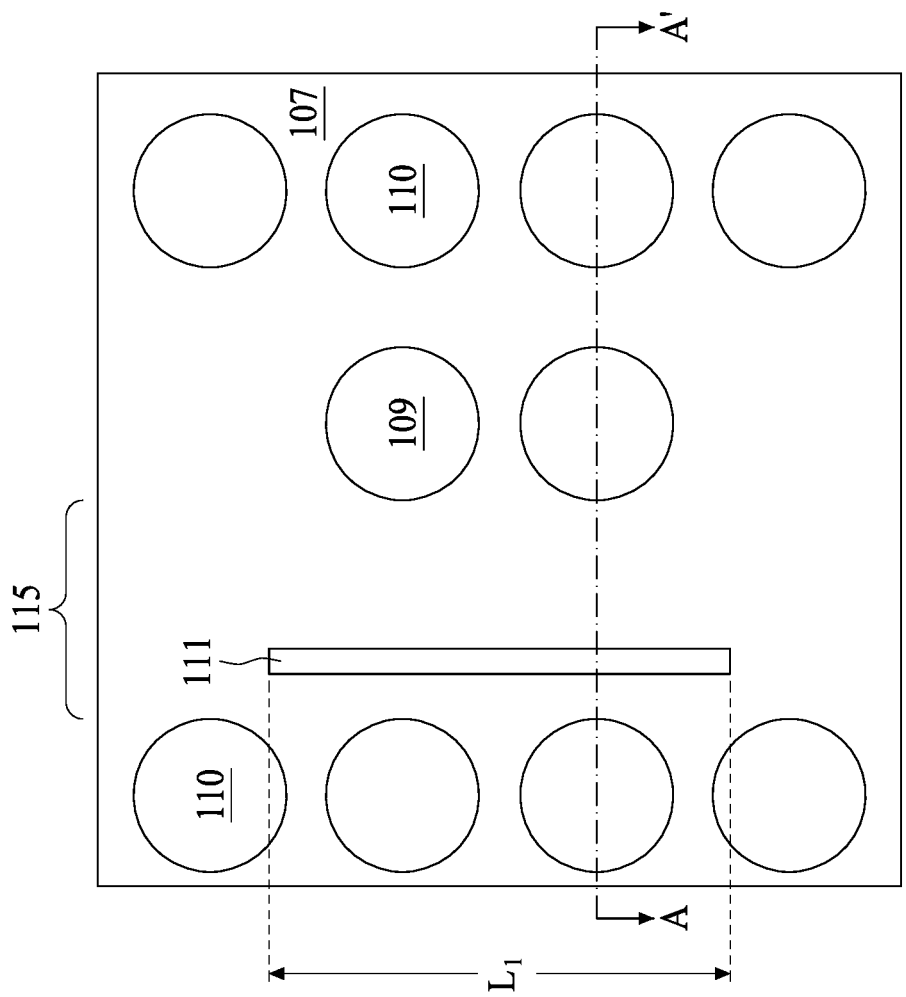

FIG. 1B illustrates a top down view of the structure of FIG. 1A, wherein FIG. 1A is a cross-sectional view of FIG. 1B through line A-A' in FIG. 1B. As can be seen, in this embodiment the first spacer 111 is located within the underfill material dispensing region 115 and between the surface device underbump metallizations 109 that will be used for the placement of a device such as an integrated passive device (not illustrated in FIG. 1B but illustrated and discussed further below with respect to FIGS. 2A-2B) and an adjacent one of the first external connection underbump metallizations 110. In an embodiment the first spacer 111 may have a first length $L_1$ of between about 3/5 of a surface device length $L_{SD}$ of a first surface device 203 (not illustrated in FIG. 1A but illustrated and discussed below with respect to FIG. 2A) and about 6/5 of the surface device length $L_{SD}$ of the first surface device 203, although any suitable dimension may be utilized.

Figure 2A:
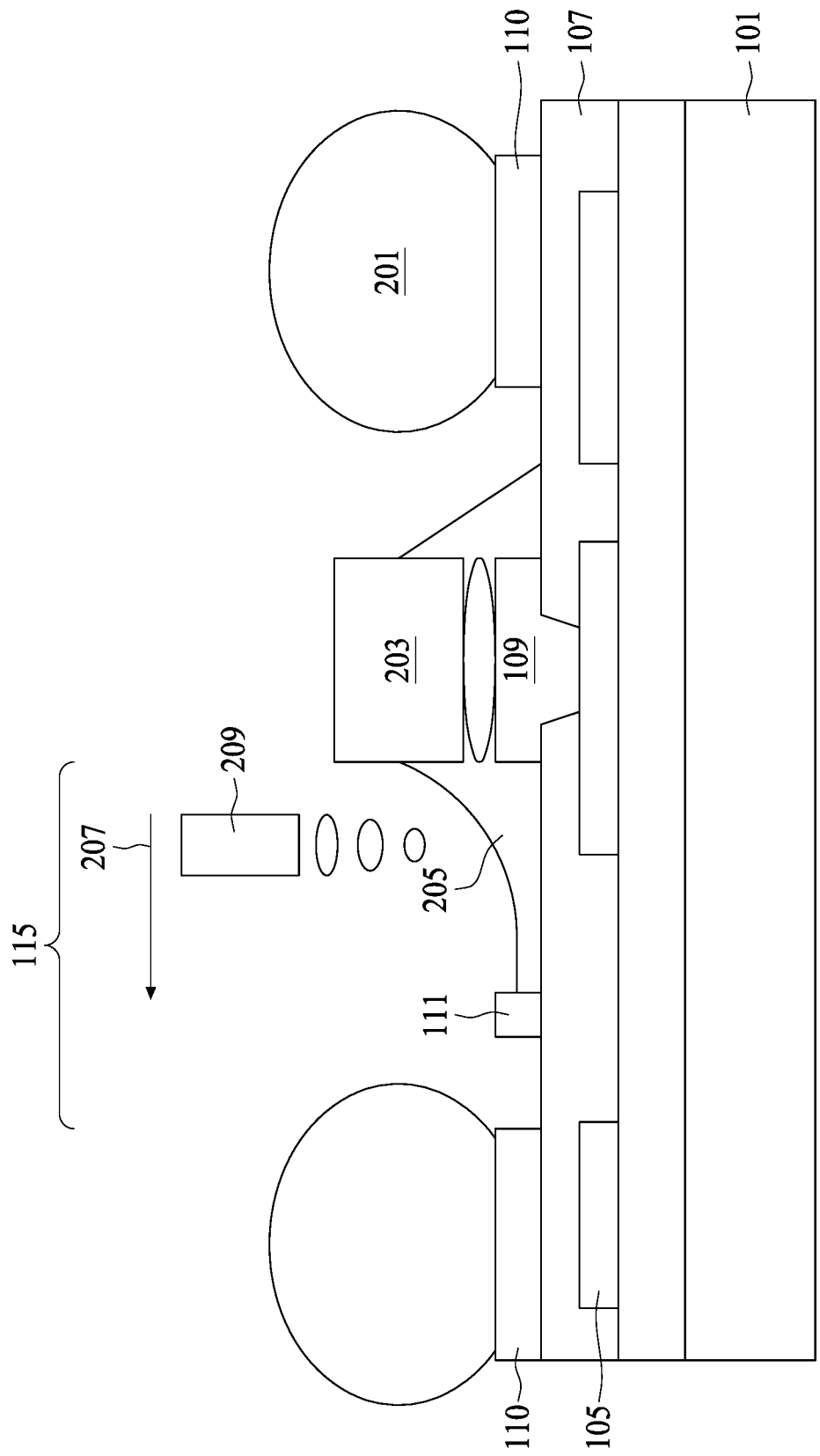
FIGS. 2A-2B illustrate a dispensing of an underfill material in accordance with some embodiments.
Figure 2B:
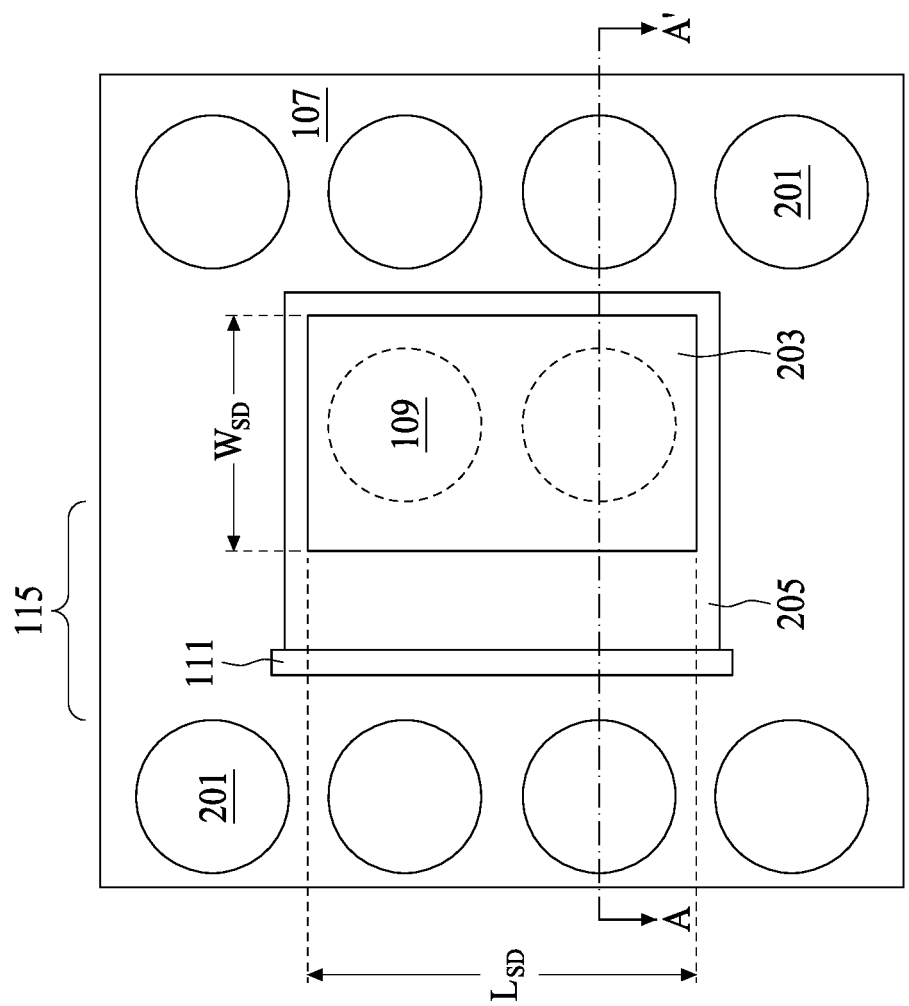

FIGS. 2A-2B illustrate a bonding of a first surface device 203 onto the surface device underbump metallization 109, a placement of first external connections 201 onto the first external connection underbump metallizations 110, and the placement of an underfill material 205 between the first surface device 203 and the first passivation layer 107. In an embodiment the first surface device 203 may be used to provide additional functionality or programming to the semiconductor device 100. In an embodiment the first surface device 203 may be a surface mount device (SMD) or an integrated passive device (IPD) that comprise passive devices such as resistors, inductors, capacitors, jumpers, combinations of these, or the like that are desired to be connected to and utilized in conjunction with the semiconductor device 100.

In an embodiment, the first surface device 203 is connected between separate ones of the surface device underbump metallizations 109 that connect to separate contact pads 105. The first surface device 203 may be connected to the surface device underbump metallizations 109, for example, by sequentially dipping connectors such as solder balls of the first surface device 203 into flux, and then using a pick-and-place tool in order to physically align the connectors of the first surface device 203 with individual ones of the surface device underbump metallizations 109. In an embodiment in which the first surface device 203 uses connectors such as solder balls, once the first surface device 203 has been placed a reflow process may be performed in order to physically bond the first surface device 203 with the underlying surface device underbump metallizations 109 and a flux clean may be performed. However, any other suitable connector or connection process may be utilized, such as metal-to-metal bonding or the like.

The first surface device 203 may be formed to fit onto the surface device underbump metallizations 109 and spaced apart from the first external connections 201. In an embodiment the first surface device 203 may have the surface device length $L_{SD}$ of between about 0.5 mm and about 5 mm, such as about 0.5 mm, and may have a surface device width $W_{SD}$ of between about 0.5 mm and about 5 mm, such as about 0.5 mm. However, any suitable dimensions may be used.

Once the first surface device 203 has been bonded to the surface device underbump metallizations 109, the underfill material 205 may be placed between the first surface device 203 and the first passivation layer 107 in order to help protect and isolate the first surface device 203 that has been bonded. In an embodiment the underfill material 205 is a protective material used to cushion and support the first surface device 203 from operational and environmental degradation, such as stresses caused by the generation of heat during operation. The underfill material 205 may comprise, for example, a liquid epoxy or other protective material, and then cured to harden.

In an embodiment the underfill material 205 may be placed between the first surface device 203 and the first passivation layer 107 by dispensing the underfill material 205 into the underfill material dispensing region 115 between the surface device underbump metallization 109 and the first external connection underbump metallization 110. The underfill material 205 may be injected into the underfill material dispensing region 115 in liquid form such that it flows between the first surface device 203 and the first passivation layer 107. However, because the underfill material 205 is dispensed between the first surface device 203 and the first external connection underbump metallization 110, while the underfill material 205 will move in between the first surface device 203 and the first passivation layer 107 (as desired), some amount of the underfill material 205 will also move (or "creep") in a first direction (represented in FIG. 2A by the arrow labeled 207) away from the first surface device 203. If the underfill material 205 reaches the adjacent one of the first external connection underbump metallizations 110, an undesired interference with the first external connection underbump metallization 110 will occur.

However, with the manufacture and presence of the first spacer 111, the first spacer 111 will act as a physical barrier to the movement of the underfill material 205. By acting as a physical barrier to the movement of the underfill material 205, the first spacer 111 will physically prevent the underfill material 205 from coming into contact with the adjacent first external connection underbump metallization 110. As such, no contamination through physical contact can occur, and no undesired interactions will interfere with the first external connection underbump metallization 110.

The first external connections 201 may be used to provide an electrical connection between the contact pads 105 and, e.g., an external device (not separately illustrated). In an embodiment the first external connections 201 may be contact bumps such as microbumps or controlled collapse chip connection (C4) bumps and may comprise a material such as tin, or other suitable materials, such as silver or copper. In an embodiment in which the first external connections 201 are tin solder bumps, the first external connections 201 may be formed by initially forming a layer of tin through any suitable method such as evaporation, electroplating, printing, solder transfer, ball placement, etc, to a thickness of, e.g., about 100 µm. Once a layer of tin has been formed on the structure, a reflow is performed in order to shape the material into the desired bump shape.

FIG. 2B illustrates a top down view of the embodiments illustrated in FIG. 2A, with FIG. 2A being a cross-section view of FIG. 2B along line A-A' in FIG. 2B. As can be seen in this view, the dispensed underfill material 205 has attempted to creep away from its desired position adjacent to the first surface device 203 and towards the first external connection underbump metallizations 110, but has been physically blocked from contact with the first external connection underbump metallizations 110 by the presence of the first spacer 111. As such, no contamination of the first external connection underbump metallizations 110 can occur from the dispensing of the underfill material 205.

Figure 3A:
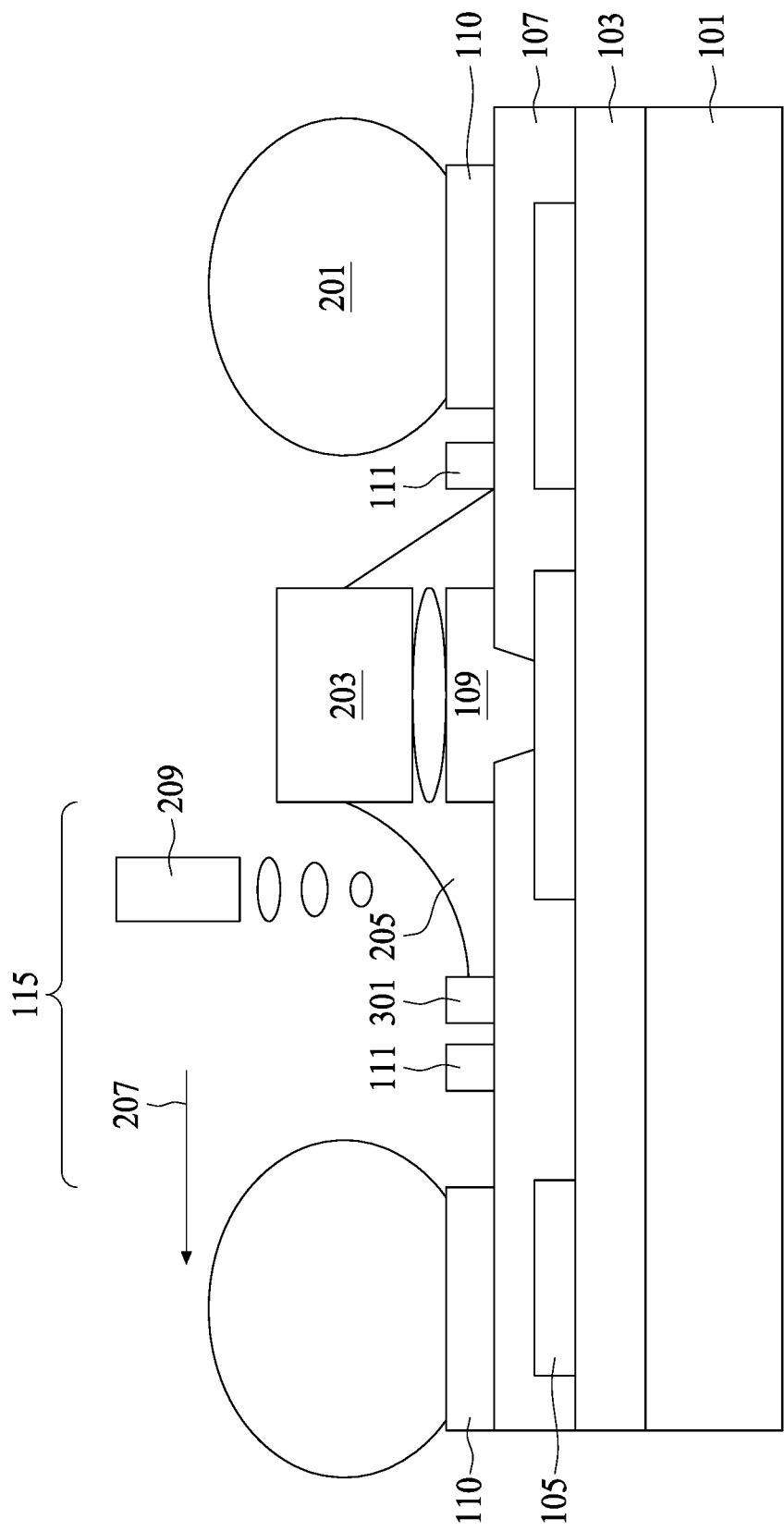
FIGS. 3A-3B illustrate a second spacer in conjunction with the first spacer in accordance with some embodiments.
Figure 3B:
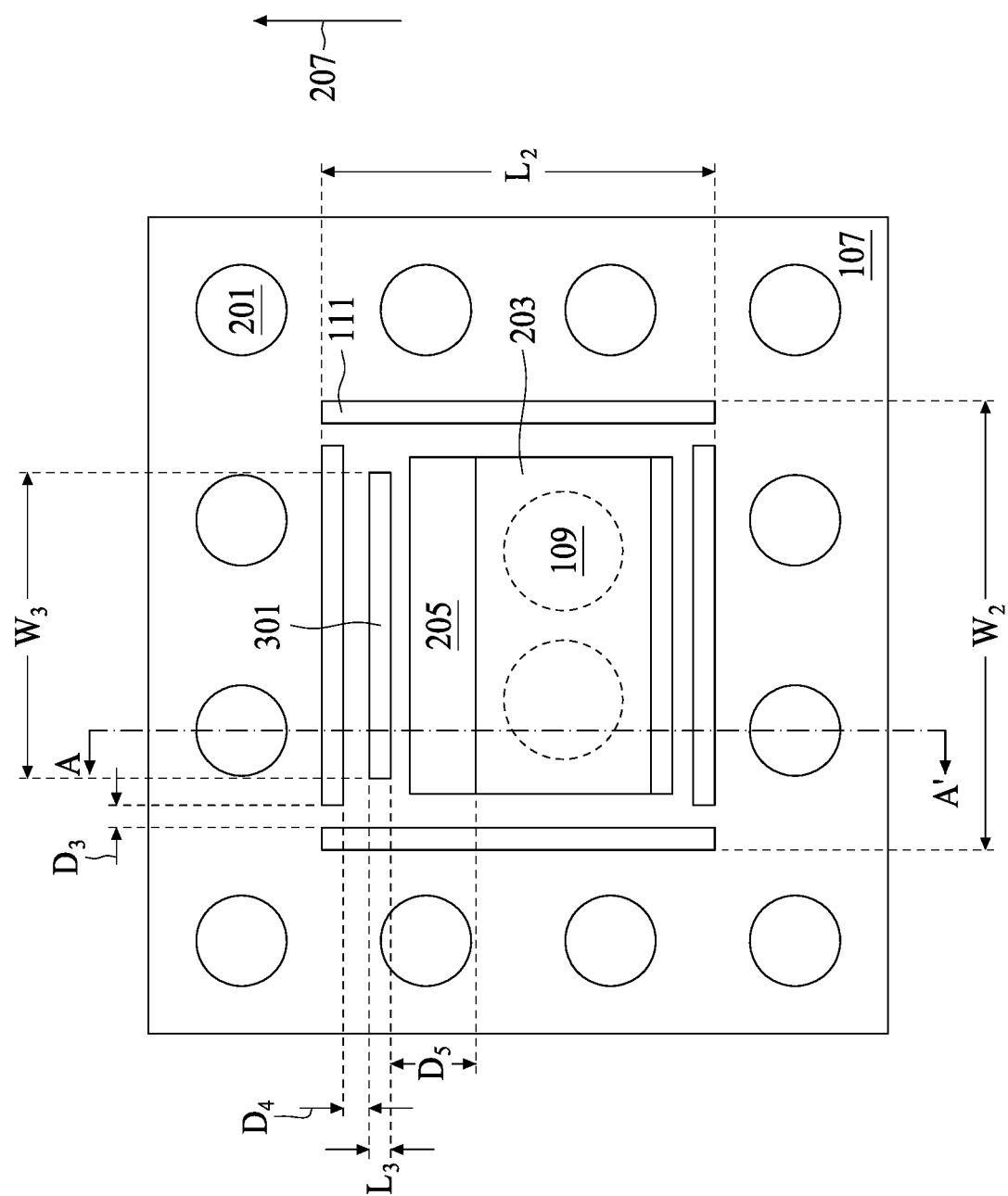

FIGS. 3A-3B illustrate an embodiment in which the first spacer 111 is formed in the shape of a box (in the top down view illustrated in FIG. 3B) that surrounds the surface device underbump metallizations 109 and separates the surface device underbump metallizations 109 from all of the first external connection underbump metallizations 110, wherein FIG. 3A is a cross-sectional view of FIG. 3B through line A-A' in FIG. 3B. In this embodiment the first spacer 111 (which may still have sections that have the first width $W_1$ as described above with respect to FIG. 1A) may be formed to have an overall second width $W_2$ of between about ⅗ of the surface device length $L_{SD}$ and about 6/5 of the surface device length $L_{SD}$, and may be formed to have an overall second length $L_2$ of between about ⅗ of the surface device length $L_{SD}$ and about 6/5 of the surface device length $L_{SD}$. However, any suitable dimensions may be utilized.

By forming the first spacer 111 as a box that surrounds the surface device underbump metallizations 109, additional protection from the undesired creeping of the underfill material 205 may be achieved. In particular, while the creep is not as pronounced in other directions as in the first direction 207 (see FIG. 2A), some creeping of the underfill material 205 may still occur in directions other than the first direction 207. However, with the positioning of the first spacers 111 on additional sides of the surface device underbump metallizations 109 (e.g., two sides, three sides, or all sides), the first spacer 111 will be in place to provide the physical boundary that will help prevent the undesired creeping of the underfill material 205.

Additionally, if desired, the first spacer 111 in this embodiment may be formed as a discontinuous structure. For example, in this embodiment each side of the first spacer 111 may run in a straight line but does not physically contact another side of the first spacer 111. For example, the first spacer 111 may have openings (not separately labeled in FIG. 3B) such that a first side of the first spacer 111 is separated from a second side of the first spacer 111 by a third distance $D_3$ of between about 2 µm and about 40 µm, such as about 10 µm. However, any suitable distance may be used.

By forming the first spacer 111 as a discontinuous structure, certain negative effects from the placement of the first spacer 111 around the surface device underbump metallizations 109 may be avoided. For example, by forming the first spacer 111 as a discontinuous structure, negative effects that may occur because of an electrical proximity effect may be avoided. Such an avoidance will work to increase the efficiency of the overall device.

Additionally, in the embodiment illustrated in FIGS. 3A-3B, if desired, a second spacer 301 may also be formed so that there is a larger number of spacers (e.g., two spacers such as the first spacer 111 and the second spacer 301) in the first direction 207 between the surface device underbump metallization 109 and the first external connection underbump metallization 110 than in other directions in order to help buttress the abilities of the first spacer 111 in stopping the undesired contact between the underfill material 205 and adjacent first external connection underbump metallizations 110 in the primary direction of creep of the underfill material 205. In an embodiment, the second spacers 301 may be formed using similar materials and using similar processes as those described above with respect to the first spacer 111. For example, the second spacers 301 may be formed at the same time as the surface device underbump metallizations 109 and the first external connection underbump metallizations 110. In a particular embodiment the second spacers 301 may be formed from a material such as titanium formed through a process such as sputtering or electroplating, to a thickness of between about 0.7 µm and about 10 µm, such as about 5 µm, although any suitable materials, methods of manufacture, or dimensions may be utilized.

To assist in the prevention of the underfill material 205 from creeping into undesired regions, the second spacer 301 may be placed within the underfill material dispensing region 115 and within the box formed by the first spacer 111. As such, the second spacer 301 may be formed to have a third width $W_3$ of between about ⅔ of the surface device length $L_{SD}$ and about ⅘ of the surface device length $L_{SD}$, and may be formed to have a third length $L_3$ of between about 2 µm and about 100 µm, such as about 10 µm. The second spacer 301 may also be spaced apart from the first spacer 111 by a fourth distance $D_4$ of between about 2 µm and about 40 µm, such as about 15 µm and spaced apart from the first surface device 203 by a fifth distance $D_5$ of between about 10 µm and about 1000 µm, such as about 250 µm.

By forming the second spacer 301 along the first direction 207, the second spacer 301 will work in conjunction with the first spacer 111 in order to prevent creeping of the underfill material 205. For example, any underfill material 205 whose movement in the first direction 207 may not have been stopped by a single one of the first spacer 111 or the second spacer 301 may be stopped by the combination of the first spacer 111 and the second spacer 301. As such, additional protection may be provided by the combination of the first spacer 111 and the second spacer 301.

Figure 4A:
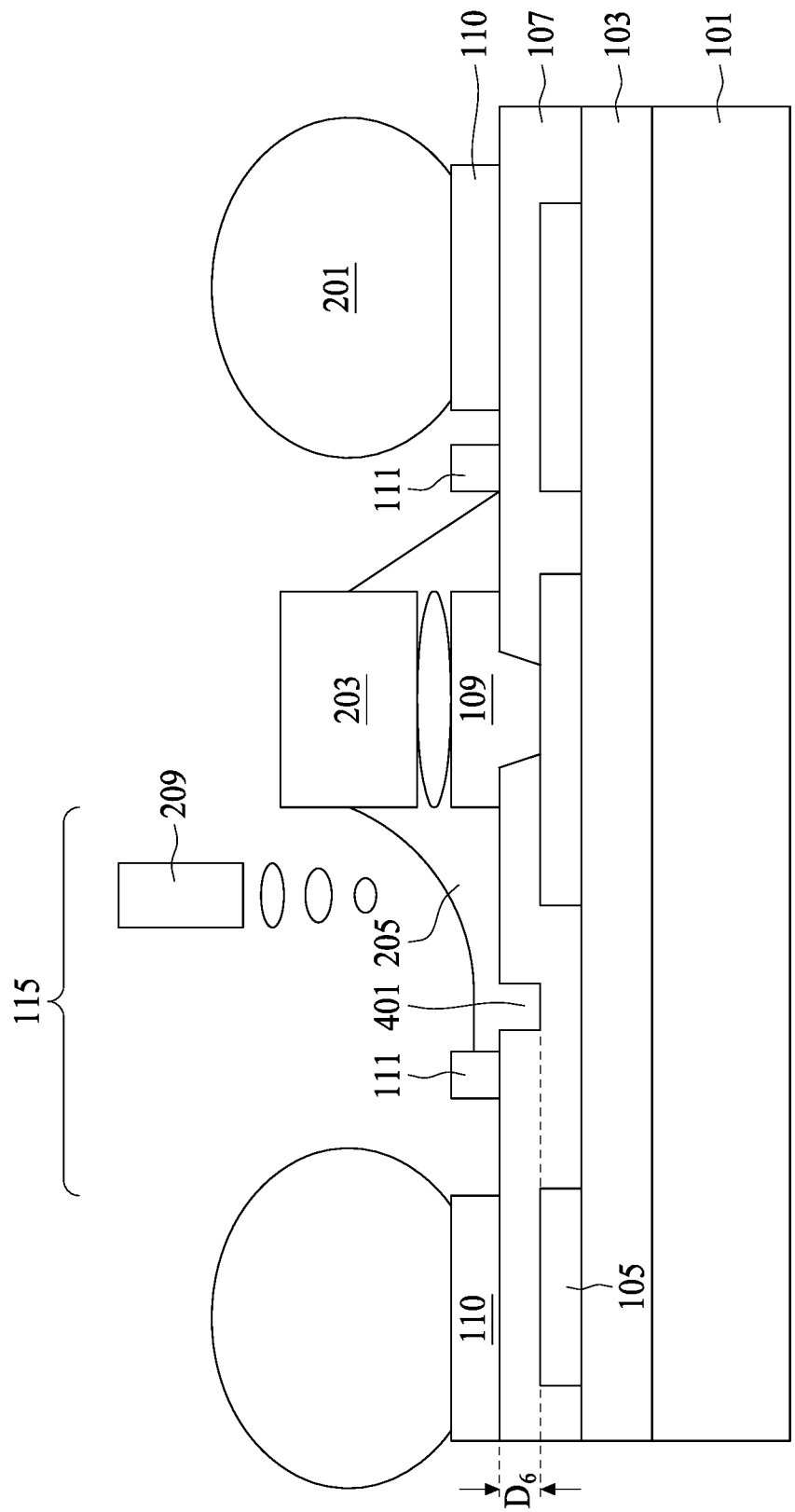
FIGS. 4A-4B illustrate a first trench in conjunction with the first spacer in accordance with some embodiments.
Figure 4B:
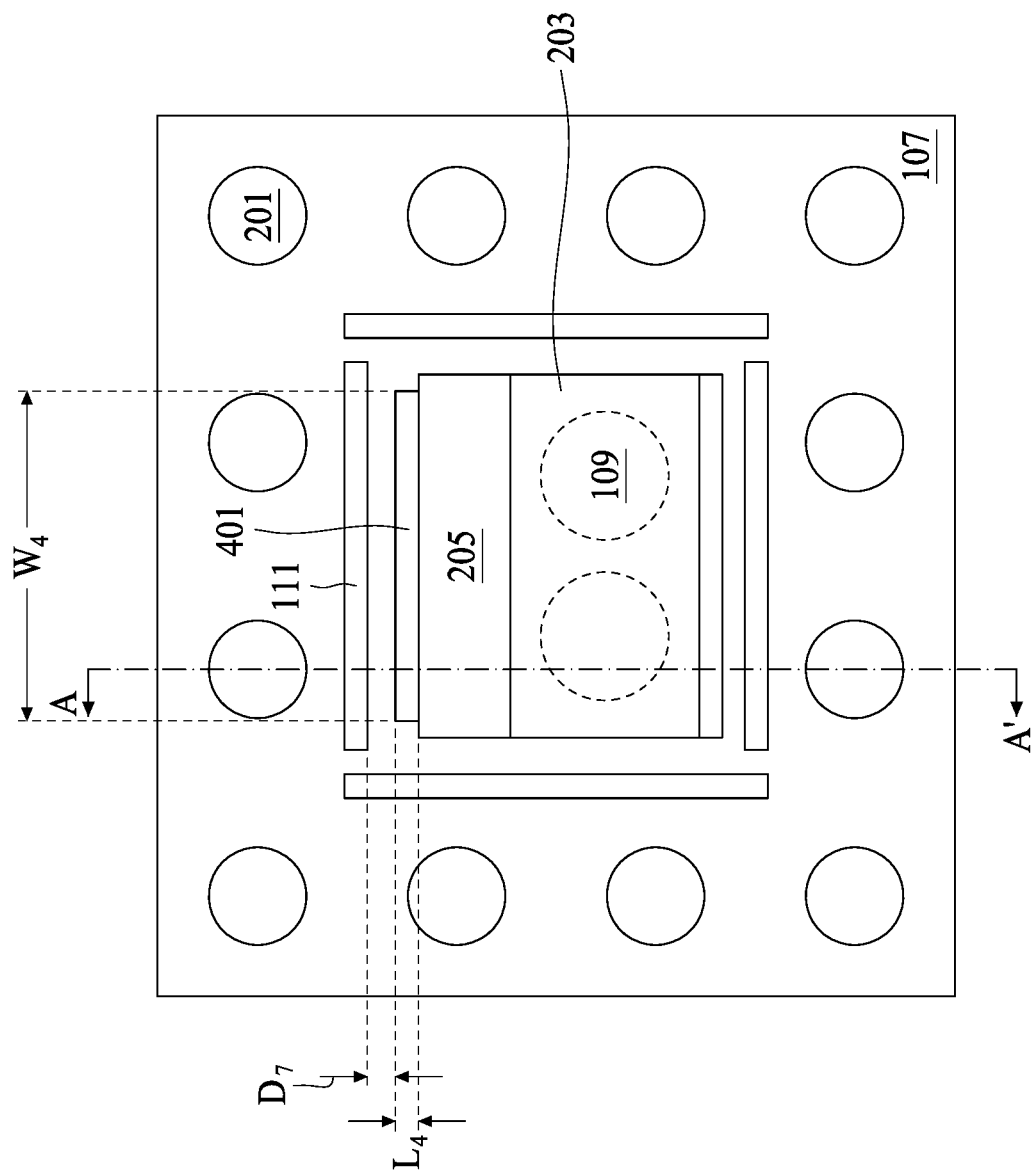

FIGS. 4A-4B illustrate another embodiment in which the first spacer 111 is formed as a discontinuous box and in which, instead of forming the second spacer 301 (as described above with respect to FIGS. 3A-3B), a first trench 401 is formed within the first passivation layer 107 in order to assist with the prevention of undesired creeping of the underfill material 205, wherein FIG. 4A is a cross-sectional view of FIG. 4B through line A-A' in FIG. 4B. In an embodiment the first trench 401 may be formed either before or after the formation of the surface device underbump metallizations 109, the first external connection underbump metallizations 110, and the first spacer 111, and may be formed using, e.g., a suitable photolithographic masking and etching process, whereby a photosensitive material is deposited and patterned over the first passivation layer 107 and the patterned photosensitive material is then used as a mask during an etching process to remove material from exposed portions of the first passivation layer 107.

In an embodiment the first trench 401 may be formed to have a fourth width $W_4$ of between about 10 µm and about 100 µm, such as about 20 µm, and also to have a fourth length $L_4$ of between about ⅔ of the surface device length $L_{SD}$ and about ⅘ of the surface device length $L_{SD}$, such as about 20 µm. Additionally, the first trench 401 may be formed to extend into the first passivation layer 111 a sixth distance $D_6$ of between about 2 µm and about 10 µm, such as about 5 µm, and may be spaced apart from the first spacer 111 by a seventh distance $D_7$ of between about 5 µm and about 100 µm, such as about 15 µm. However, any suitable dimensions may be utilized.

Once the first trench 401 has been formed, the underfill material 205 may be dispensed within the underfill material dispensing region 115 as described above with respect to FIGS. 2A-2B. However, with the presence of the first trench 401, the underfill material 205 that is creeping in the first direction 207 will encounter the first trench 401 as a barrier to continued movement in the first direction 207 and will at least partially fill if not fully fill the first trench 401 prior to encountering the first spacer 111. As such, the combination of the first trench 401 and the first spacer 111 will work together to further prevent the undesired creeping of the underfill material 205.

Figure 5A:
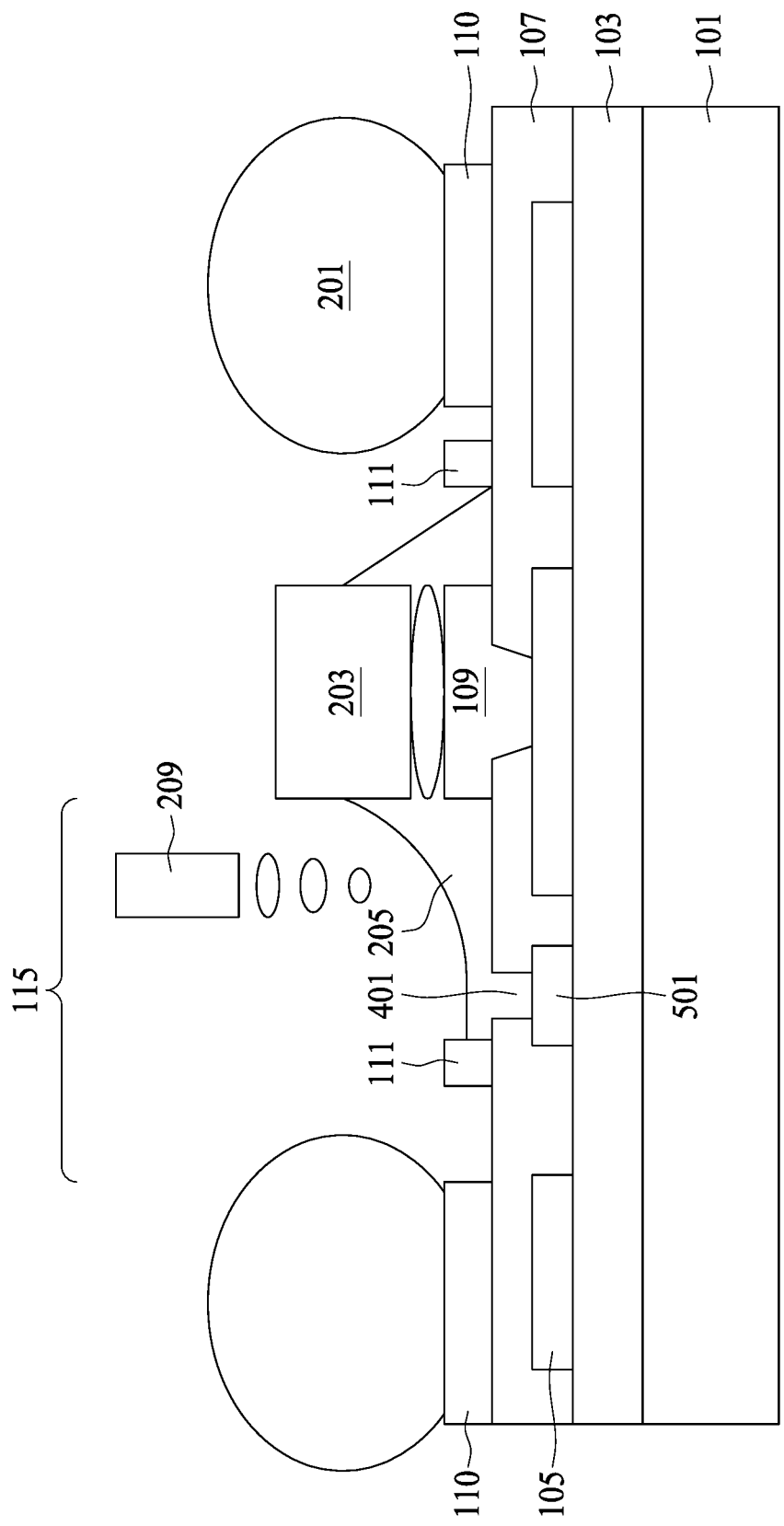

FIGS. 5A-5B illustrate another embodiment similar to the embodiment illustrated and discussed in FIGS. 4A-4B in which the first spacer 111 is formed as a discontinuous box and the first trench 401 is formed in the first passivation layer 107, wherein FIG. 5A is a cross-sectional view of FIG. 5B through line A-A' in FIG. 5B. In this embodiment, however, a trench contact pad 501 is formed such that, when material of the first passivation layer 107 is removed to form the first trench 401, the first trench 401 will expose a portion of the trench contact pad 501. By using the trench contact pad 501 below the first trench 401, greater process control during the formation of the first trench 401 may be achieved.

In an embodiment the trench contact pad 501 that is exposed by the first trench 401 is formed using similar materials and processes, and in some embodiments formed simultaneously with, the contact pads 105 as described above with respect to FIGS. 1A-1B, although, if desired, the trench contact pad 501 may be a dummy material that is not otherwise electrically connected. For example, the trench contact pad 501 that is exposed by the first trench 401 may be formed from a material such as aluminum using a process such as sputtering and patterning, however, any suitable materials and processes may be utilized.

The trench contact pad 501 that is exposed by the first trench 401 may be formed in order to provide a suitable landing or etch stop function during the formation of the first trench 401. As such, the trench contact pad 501 may be formed to have a fifth width $W_5$ of between about ⅖ of the surface device length $L_{SD}$ and about ⅘ of the surface device length $L_{SD}$, and a fifth length $L_5$ of between about 5 μm and about 100 μm, such as about 10 μm. However, any suitable dimensions may be utilized. With additional landing and etch stop functionality, any undesired impacts from the formation of the first trench 401 (such as an undesired overetching or underetching) may be minimized or eliminated.

Figure 6:
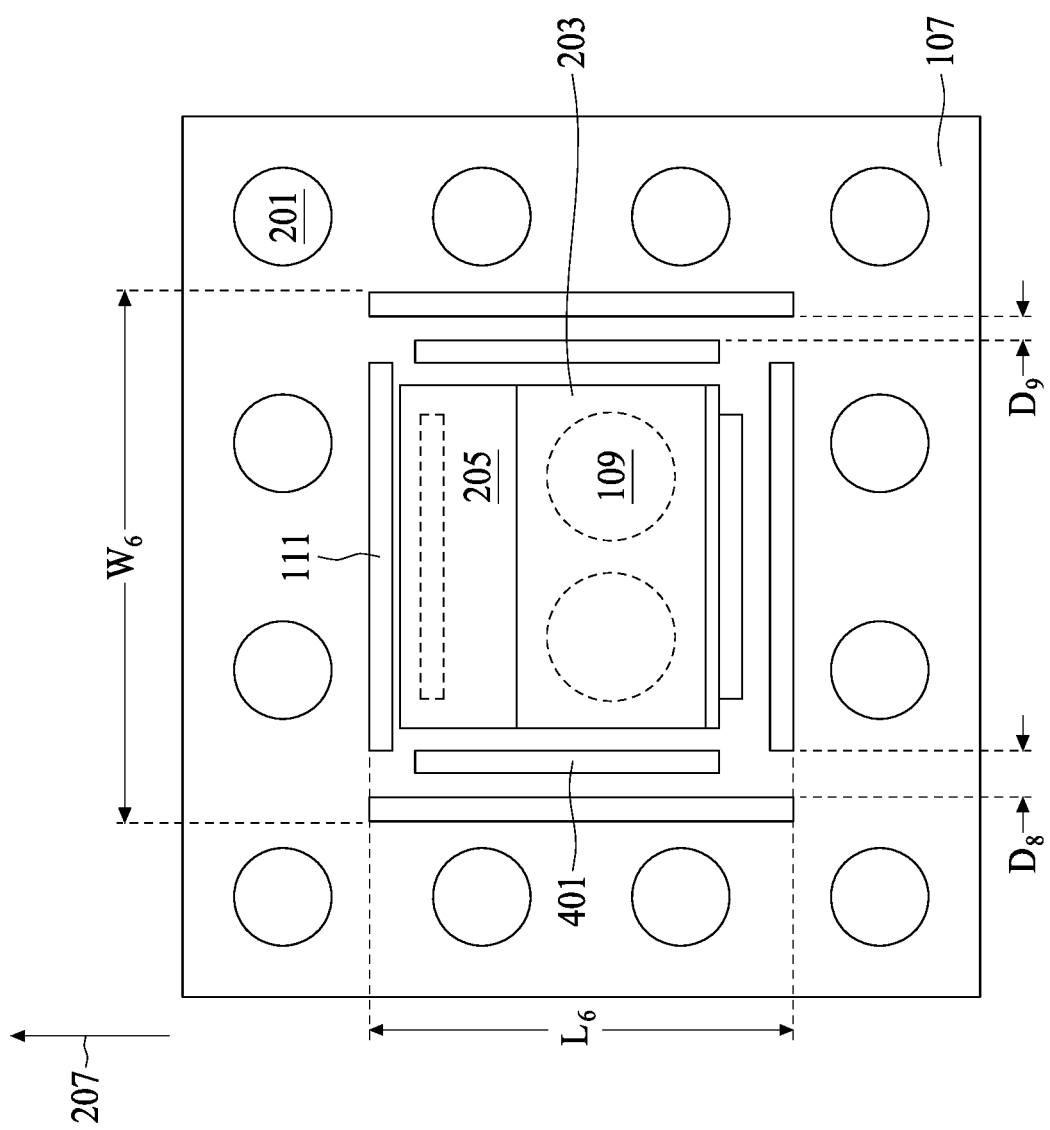
FIG. 6 illustrates the second spacer formed as a discontinuous box in accordance with some embodiments.

FIG. 6 illustrates yet another embodiment in which the first spacer 111 is formed in the discontinuous box shape (as viewed in the top down view and as described above with respect to FIGS. 3A-3B) and which also comprises the first trench 401. In this embodiment, however, while the first trench 401 may be formed from the processes as described above with respect to FIGS. 4A-4B, the first trench 401 is also formed in a box shape (in a top down view) that also surrounds the surface device underbump metallization 109 like the first spacer 111. For example, the first trench 401 may be formed with an overall sixth width $W_6$ of between about 6/5 of the surface device length $L_{SD}$ and about 8/5 of the surface device length $L_{SD}$, and an overall sixth length $L_6$ of between about 6/5 of the surface device length $L_{SD}$ and about 8/5 of the surface device length $L_{SD}$. However, any suitable dimensions may be utilized.

By forming the first trench 401 as a box that surrounds the surface device underbump metallization 109, the first trench 401 will work in conjunction with the first spacer 111 (also in the shape of the box) to help mitigate or eliminate creep of the underfill material 205 in each direction and not just in the first direction 207. By helping to reduce or eliminate creep of the underfill material 205, damage from any movement of the underfill material 205 in any direction may be reduced or eliminated. As such, a more efficient process and device may be obtained.

Additionally, if desired, in order to mitigate any undesired effects from the formation of the first trench 401 as a box, the first trench 401 in this embodiment may be formed as a discontinuous shape. For example, the first trench 401 may be formed with openings (not separately labeled) that separate the different sections of the first trench 401 by a eight distance $D_8$ of between about 2 μm and about 100 μm, such as about 10 μm. Additionally, the first trench 401 may be formed a ninth first distance $D_9$ away from the first spacer 111 of between about 5 μm and about 100 μm, such as about 10 μm. However, any suitable dimensions may be used.

Figure 7A:
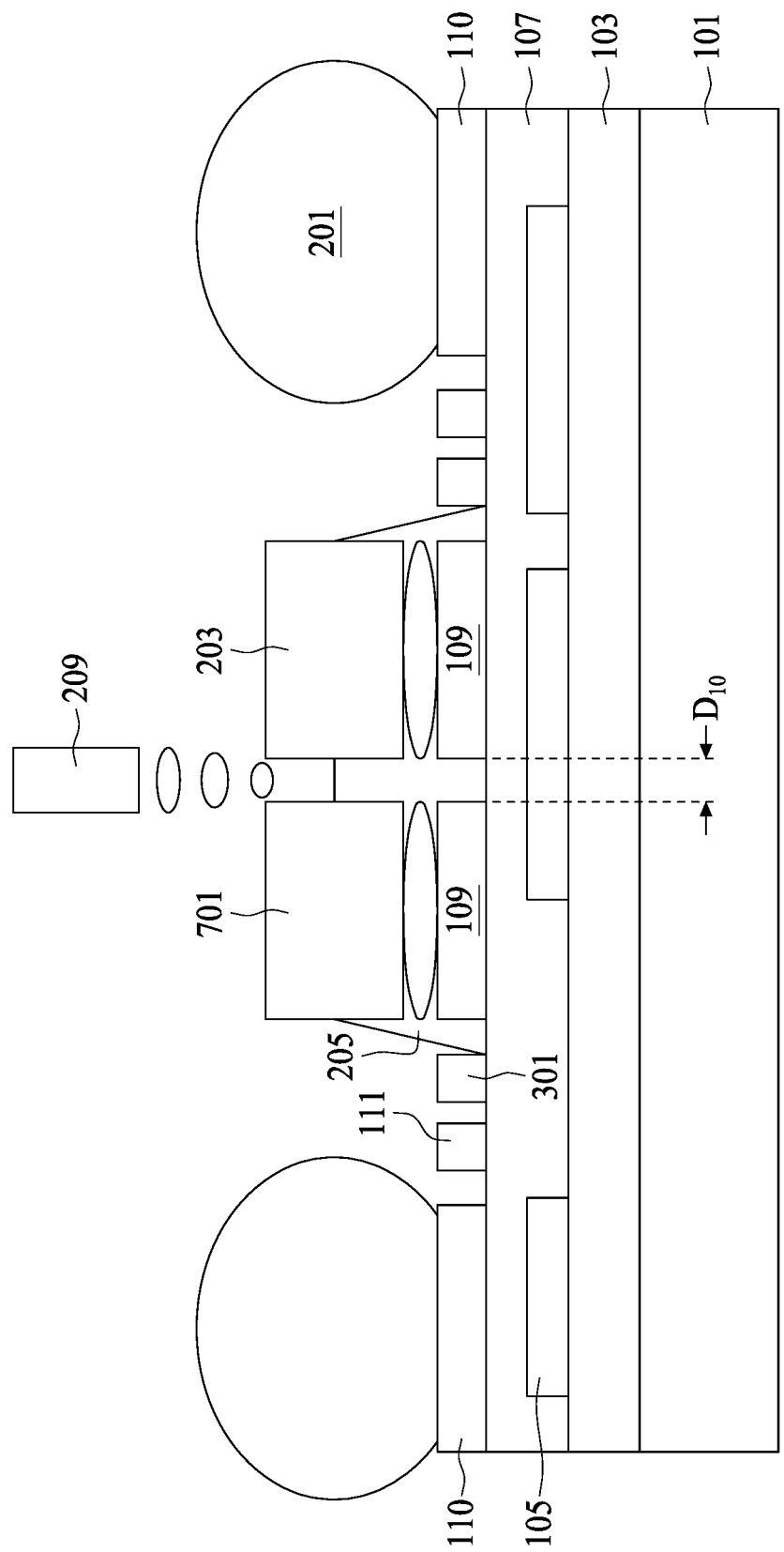
FIGS. 7A-7B illustrate a placement of two surface devices in accordance with some embodiments.
Figure 7B:
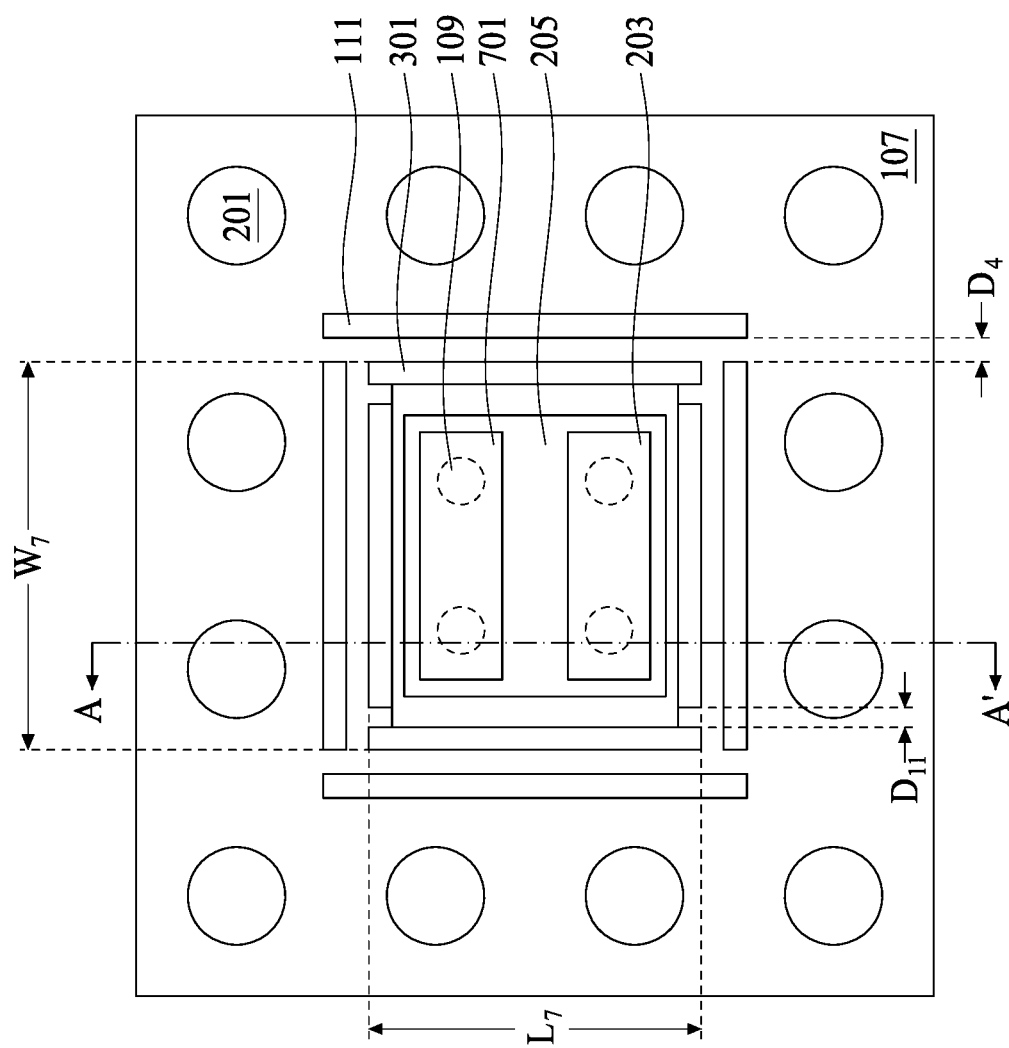

FIGS. 7A-7B illustrate yet another embodiment wherein the first spacer 111 is formed in the discontinuous box shape (as viewed in the top down view and as described above with respect to FIGS. 3A-3B), wherein FIG. 7A is a cross-sectional view of FIG. 7B through line A-A' in FIG. 7B. In this embodiment, however, while the first surface device 203 is located within the first spacer 111, a second surface device 701 may also be placed onto a second set of the surface device underbump metallizations 109 that is located within the first spacer 111. In an embodiment the second surface device 701 may be similar to the first surface device 203 such as by being, for example, SMDs or IPDs bonded to respective ones of the surface device underbump metallizations 109. However, any suitable structure may be utilized. In this embodiment the second surface device 701 may be spaced apart from the first surface device 203 by a tenth distance $D_{10}$ of between about 100 μm and about 1000 μm, such as about 300 μm, although any suitable dimensions may be utilized.

Once the second first surface device 203 has been bonded to the surface device underbump metallization 109, the underfill material 205, instead of being dispensed between the first spacer 111 and the first surface device 203, is instead dispensed between the first surface device 203 and the second surface device 701. However, the formation and location of the first spacer 111 will work to mitigate or eliminate the possibility of the underfill material 205 extending beyond the first surface device 203 and the second surface device 701 and coming into physical contact with adjacent first external connection underbump metallizations 110.

Optionally, and as illustrated in FIGS. 7A-7B, if desired the second spacer 301 may also be used in conjunction with the first spacer 111. In this embodiment, rather than the second spacer 301 being formed as a single straight line (as described above with respect to FIGS. 3A-3B), the second spacer 301 is instead also formed as in the shape of a box that surrounds the surface device underbump metallizations 109 upon which the first surface device 203 and the second surface device 701 are placed. For example, the second spacer 301 in this embodiment may be formed with an overall seventh width $W_7$ of between about ⅖ of the surface device length $L_{SD}$ and about ⅘ of the surface device length $L_{SD}$, and a seventh length $L_7$ of between about ⅖ of the surface device length $L_{SD}$ and about ⅘ of the surface device length $L_{SD}$, although any suitable dimensions may be used. Additionally, the second spacer 301 may be formed the fourth distance $D_4$ away from the first spacer 111.

Additionally in this embodiment, if desired and in order to mitigate any undesired effects from the formation of the second spacer 301 as a box, the second spacer 301 in this embodiment may be formed as a discontinuous shape. For example, the second spacer 301 may be formed with openings (not separately labeled) that separate the different sections of the second spacer 301 by a eleventh distance $D_{11}$ of between about 2 μm and about 100 μm, such as about 10 μm.

By forming the second spacer 301 as a discontinuous box that is located within the first spacer 111, a double wall of physical barriers may be formed. These physical barriers, during the dispensing of the underfill material 205, will work to prevent undesired creeping and bleeding of the underfill material 205 from coming into contact with adjacent underbump metallizations such as the first external connection underbump metallizations 110. Such a prevention helps prevent poisoning of the first external connection underbump metallizations 110 and leads to a more efficient method and process for manufacturing semiconductor devices.

FIGS. 8A-11 illustrate another embodiment in which, rather, than using the first spacer 111 or the second spacer 301, a second passivation layer 801 may be formed prior to the first external connection underbump metallizations 110, and wherein the first external connection underbump metallizations 110 in the ball mount region are the only underbump metallizations in order to help prevent creeping of the underfill material 205 from poisoning adjacent underbump metallizations. In the embodiment illustrated in FIGS. 8A-11, the use of the second passivation layer 801 is illustrated with respect to an embodiment of an integrated fan out (InFO) package 800, although any suitable device or structure may be used.

In an embodiment the InFO package 800 is formed by initially forming a polymer layer 803 over a carrier substrate 805. The carrier substrate 805 comprises, for example, silicon based materials, such as glass or silicon oxide, or other materials, such as aluminum oxide, combinations of any of these materials, or the like. The carrier substrate 805 is planar in order to accommodate an attachment of semiconductor devices such as a first semiconductor device 807.

The polymer layer 803 is placed over the carrier substrate 805 with the help of, e.g., an adhesive layer (not separately illustrated in FIG. 8A) and is utilized in order to provide protection to, e.g., the first semiconductor device 807 once the first semiconductor device 807 has been attached. In an embodiment the polymer layer 803 may be polybenzoxazole (PBO), although any suitable material, such as polyimide or a polyimide derivative, Solder Resistance (SR), or Ajinomoto build-up film (ABF) may alternatively be utilized. The polymer layer 803 may be placed using, e.g., a spin-coating process to a thickness of between about 2 μm and about 15 μm, such as about 5 μm, although any suitable method and thickness may alternatively be used.

Once the polymer layer 803 has been formed, a seed layer (not separately illustrated) is formed over the polymer layer 803. In an embodiment the seed layer is a thin layer of a conductive material that aids in the formation of a thicker layer during subsequent processing steps. The seed layer may comprise a layer of titanium about 1,000 Å thick followed by a layer of copper about 5,000 Å thick. The seed layer may be created using processes such as sputtering, evaporation, or PECVD processes, depending upon the desired materials. The seed layer may be formed to have a thickness of between about 0.3 μm and about 1 μm, such as about 0.5 μm.

Once the seed layer has been formed, a photoresist (not illustrated) is placed over the seed layer. In an embodiment the photoresist may be placed on the seed layer using, e.g., a spin coating technique to a height of between about 50 μm and about 250 μm, such as about 120 μm. Once in place, the photoresist may then be patterned by exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern.

In an embodiment the pattern formed into the photoresist is a pattern for vias 809. The vias 809 are formed in such a placement as to be located on different sides of subsequently attached devices such as the first semiconductor device 807. However, any suitable arrangement for the pattern of vias 809 may be utilized.

In an embodiment the vias 809 are formed within the photoresist. In an embodiment the vias 809 comprise one or more conductive materials, such as copper, tungsten, other conductive metals, or the like, and may be formed, for example, by electroplating, electroless plating, or the like. In an embodiment, an electroplating process is used wherein the seed layer and the photoresist are submerged or immersed in an electroplating solution. The seed layer surface is electrically connected to the negative side of an external DC power supply such that the seed layer functions as the cathode in the electroplating process. A solid conductive anode, such as a copper anode, is also immersed in the solution and is attached to the positive side of the power supply. The atoms from the anode are dissolved into the solution, from which the cathode, e.g., the seed layer, acquires the dissolved atoms, thereby plating the exposed conductive areas of the seed layer within the opening of the photoresist.

Once the vias 809 have been formed using the photoresist and the seed layer, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may alternatively be utilized. The removal of the photoresist may expose the underlying portions of the seed layer.

Once exposed a removal of the exposed portions of the seed layer may be performed. In an embodiment the exposed portions of the seed layer (e.g., those portions that are not covered by the vias 809) may be removed by, for example, a wet or dry etching process. For example, in a dry etching process reactants may be directed towards the seed layer using the vias 809 as masks. In another embodiment, etchants may be sprayed or otherwise put into contact with the seed layer in order to remove the exposed portions of the seed layer. After the exposed portion of the seed layer has been etched away, a portion of the polymer layer 803 is exposed between the vias 809.

After the vias 809 have been formed, the first semiconductor device 807 is attached to the polymer layer 803 within the vias 809. In an embodiment the first semiconductor device 807 comprises a first substrate 811, first active devices (not individually illustrated), first metallization layers (also not individually illustrated), first contact pads (not illustrated), a third passivation layer 815, and second external connectors 817. The first substrate 811 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as capacitors, resistors, inductors and the like that may be used to generate the desired structural and functional requirements of the design for the first semiconductor device 807. The first active devices may be formed using any suitable methods either within or else on the first substrate 811.

The first metallization layers are formed over the first substrate 811 and the first active devices and are designed to connect the various active devices to form functional circuitry. In an embodiment the first metallization layers are formed of alternating layers of dielectric and conductive material and may be formed through any suitable process (such as deposition, damascene, dual damascene, etc.). In an embodiment there may be four layers of metallization separated from the first substrate 811 by at least one interlayer dielectric layer (ILD), but the precise number of first metallization layers is dependent upon the design of the first semiconductor device 807.

The first contact pads may be formed over and in electrical contact with the first metallization layers. The first contact pads may comprise aluminum, but other materials, such as copper, may alternatively be used. The first contact pads may be formed using a deposition process, such as sputtering, to form a layer of material (not shown) and portions of the layer of material may then be removed through a suitable process (such as photolithographic masking and etching) to form the first contact pads. However, any other suitable process may be utilized to form the first contact pads. The first contact pads may be formed to have a thickness of between about 0.5 µm and about 4 µm, such as about 1.45 µm.

The third passivation layer 815 may be formed on the first substrate 811 over the first metallization layers and the first contact pads. The third passivation layer 815 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The third passivation layer 815 may be formed through a process such as chemical vapor deposition (CVD), although any suitable process may be utilized, and may have a thickness between about 0.5 µm and about 5 µm, such as about 9.25 KÅ.

The second external connectors 817 may be formed to provide conductive regions for contact between the first contact pads and, e.g., a first redistribution layer 819. In an embodiment the second external connectors 817 may be conductive pillars and may be formed by initially forming a photoresist (not shown) over the third passivation layer 815 to a thickness between about 5 µm to about 20 µm, such as about 10 µm. The photoresist may be patterned to expose portions of the third passivation layer 815 through which the conductive pillars will extend. Once patterned, the photoresist may then be used as a mask to remove the desired portions of the third passivation layer 815, thereby exposing those portions of the underlying first contact pads to which the second external connectors 817 will make contact.

The second external connectors 817 may be formed within the openings of both the third passivation layer 815 and the photoresist. The second external connectors 817 may be formed from a conductive material such as copper, although other conductive materials such as nickel, gold, or metal alloy, combinations of these, or the like may also be used. Additionally, the second external connectors 817 may be formed using a process such as electroplating, by which an electric current is run through the conductive portions of the first contact pads to which the second external connectors 817 are desired to be formed, and the first contact pads are immersed in a solution. The solution and the electric current deposit, e.g., copper, within the openings in order to fill and/or overfill the openings of the photoresist and the third passivation layer 815, thereby forming the second external connectors 817. Excess conductive material and photoresist outside of the openings of the third passivation layer 815 may then be removed using, for example, an ashing process, a chemical mechanical polish (CMP) process, combinations of these, or the like.

However, as one of ordinary skill in the art will recognize, the above described process to form the second external connectors 817 is merely one such description, and is not meant to limit the embodiments to this exact process. Rather, the described process is intended to be merely illustrative, as any suitable process for forming the second external connectors 817 may alternatively be utilized. All suitable processes are fully intended to be included within the scope of the present embodiments.

On an opposite side of the first substrate 811 than the first metallization layers, a die attach film (DAF) 822 may be formed in order to assist in the attachment of the first semiconductor device 807 to the polymer layer 803. In an embodiment the die attach film 822 is an epoxy resin, a phenol resin, acrylic rubber, silica filler, or a combination thereof, and is applied using a lamination technique. However, any other suitable alternative material and method of formation may alternatively be utilized. In an embodiment the first semiconductor device 807 may be placed onto the polymer layer 803 using, e.g., a pick and place process. However, any suitable method of placing the first semiconductor device 807 may be used.

Once the first semiconductor device 807 has been placed, the first semiconductor device 807 and the vias 809 are encapsulated. The encapsulation may be performed in a molding device (not individually illustrated in FIG. 8A), which may comprise a top molding portion and a bottom molding portion separable from the top molding portion. When the top molding portion is lowered to be adjacent to the bottom molding portion, a molding cavity may be formed for the carrier substrate 805, the vias 809, the first semiconductor device 807.

During the encapsulation process the top molding portion may be placed adjacent to the bottom molding portion, thereby enclosing the carrier substrate 805, the vias 809 and the first semiconductor device 807 within the molding cavity. Once enclosed, the top molding portion and the bottom molding portion may form an airtight seal in order to control the influx and outflux of gasses from the molding cavity. Once sealed, an encapsulant 823 may be placed within the molding cavity. The encapsulant 823 may be a molding compound resin such as polyimide, PPS, PEEK, PES, a heat resistant crystal resin, combinations of these, or the like. The encapsulant 823 may be placed within the molding cavity prior to the alignment of the top molding portion and the bottom molding portion, or else may be injected into the molding cavity through an injection port.

Once the encapsulant 823 has been placed into the molding cavity such that the encapsulant 823 encapsulates the carrier substrate 805, the vias 809 and the first semiconductor device 807, the encapsulant 823 may be cured in order to harden the encapsulant 823 for optimum protection. While the exact curing process is dependent at least in part on the particular material chosen for the encapsulant 823, in an embodiment in which molding compound is chosen as the encapsulant 823, the curing could occur through a process such as heating the encapsulant 823 to between about 100° C. and about 130° C., such as about 125° C. for about 60 sec to about 3000 sec, such as about 600 sec. Additionally, initiators and/or catalysts may be included within the encapsulant 823 to better control the curing process.

However, as one having ordinary skill in the art will recognize, the curing process described above is merely an exemplary process and is not meant to limit the current embodiments. Other curing processes, such as irradiation or even allowing the encapsulant 823 to harden at ambient temperature, may alternatively be used. Any suitable curing process may be used, and all such processes are fully intended to be included within the scope of the embodiments discussed herein.

Once the encapsulant 823 has been cured, the encapsulant 823 is thinned in order to expose the vias 809 and the first semiconductor device 807 for further processing. The thinning may be performed, e.g., using a mechanical grinding or chemical mechanical polishing (CMP) process whereby chemical etchants and abrasives are utilized to react and grind away the encapsulant 823 and the first semiconductor device 807 until the vias 809 and the second external connectors 817 (on the first semiconductor device 807) have been exposed. As such, the first semiconductor device 807 and the vias 809 may have a planar surface that is also planar with the encapsulant 823.

However, while the CMP process described above is presented as one illustrative embodiment, it is not intended to be limiting to the embodiments. Any other suitable removal process may alternatively be used to thin the encapsulant 823 and the first semiconductor device 807 and expose the vias 809. For example, a series of chemical etches may be utilized. This process and any other suitable process may alternatively be utilized to thin the encapsulant 823 and the first semiconductor device 807, and all such processes are fully intended to be included within the scope of the embodiments.

After the vias 809 and the first contact pads have been exposed, a fourth passivation layer 818 and the first redistribution layer 819 are formed in order to interconnect the vias 809 and the second external connectors 817 to, e.g., the first semiconductor device 807 and the first surface device 203. In an embodiment the fourth passivation layer 818 may be polybenzoxazole (PBO), although any suitable material, such as polyimide or a polyimide derivative, may alternatively be utilized. The fourth passivation layer 818 may be placed using, e.g., a spin-coating process to a thickness of between about 5 µm and about 25 µm, such as about 7 µm, although any suitable method and thickness may be used.

After the fourth passivation layer 818 has been formed, openings may be made through the fourth passivation layer 818 by removing portions of the fourth passivation layer 818 to expose at least a portion of the vias 809 and the second external connectors 817. The openings allow for contact between the vias 809 and the second external connectors 817 and, e.g., the first redistribution layer 819. The openings may be formed using a suitable photolithographic mask and etching process, although any suitable process to expose portions of first redistribution layer 819 may be used.

The first redistribution layer 819 may be formed by initially forming a seed layer (not separately shown) of a titanium copper alloy through a suitable formation process such as CVD or sputtering. A photoresist (also not shown) may then be formed to cover the seed layer, and the photoresist may then be patterned to expose those portions of the seed layer that are located where the first redistribution layer 819 is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 5 µm. However, while the material and methods discussed are suitable to form the conductive material, these materials are merely exemplary. Any other suitable materials, such as AlCu or Au, and any other suitable processes of formation, such as CVD or PVD, may alternatively be used to form the first redistribution layer 819.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

After the first redistribution layer 819 has been formed, a fifth passivation layer 825 is formed over the first redistribution layer 819 in order to provide protection and isolation for the first redistribution layer 819 and the other underlying structures. In an embodiment the fifth passivation layer 825 may be polybenzoxazole (PBO), although any suitable material, such as polyimide or a polyimide derivative, may alternatively be utilized. The fifth passivation layer 825 may be placed using, e.g., a spin-coating process to a thickness of between about 5 µm and about 25 µm, such as about 7 µm, although any suitable method and thickness may alternatively be used.

After the fifth passivation layer 825 has been formed, openings may be made through the fifth passivation layer 825 by removing portions of the fifth passivation layer 825 to expose at least a portion of the underlying first redistribution layer 819. The openings allow for contact between the first redistribution layer 819 and, e.g., the second redistribution layer 821. The openings may be formed using a suitable photolithographic mask and etching process, although any suitable process to expose portions of first redistribution layer 819 may alternatively be used.

After the openings have been formed in the fifth passivation layer 825, the second redistribution layer 821 is formed in electrical connection with the first redistribution layer 819 through the fifth passivation layer 825. In an embodiment the second redistribution layer 821 is formed similar to the first redistribution layer 819 by forming a seed layer, covering the seed layer with a patterned photoresist, and plating conductive material into the patterned photoresist. However, any suitable material of method of manufacture may be used to form the second redistribution layer 821.

Additionally, while the second redistribution layer 821 may be formed to provide traces for the routing and interconnection of the various electrical components, the second redistribution layer 821 in this embodiment is also formed to provide landing pad regions such that the first external connection underbump metallizations 110 may be formed in electrical and/or physical connection with the second redistribution layer 821. In an embodiment the landing pad regions may be circular, although any suitable size and shape of the landing pad region may be used.

Once the second redistribution layer 821 has been formed, the second passivation layer 801 is formed over the second redistribution layer 821 in order to protect the second redistribution layer 821 and other underlying structures. In an embodiment the second passivation layer 801 may be similar to the first passivation layer 107 (discussed above with respect to FIG. 1), and may be formed to have a thickness of between about 10 µm and about 300 µm, such as about 20 µm. However, any suitable material or thickness may be utilized.

Once the second passivation layer 801 has been formed, second openings 827 may be formed through the second passivation layer 801 to expose portions of the second redistribution layer 821. The second openings 827 may be formed using a suitable photolithographic mask and etching process, although any suitable process to expose portions of second redistribution layer 821 may be used.

Additionally in this embodiment, at the same time that the second openings 827 to expose the portions of the second redistribution layer 821 are formed, a surface device opening 829 is also formed through the second passivation layer 801. In an embodiment the surface device opening 829 is formed to provide for an indentation within the second passivation layer 801 such that, when the underfill material 205 is dispensed, the second passivation layer 801 itself will serve as the physical barrier so that the underfill material 205 will not creep and make contact with adjacent first external connection underbump metallizations 110.

Figure 8A:
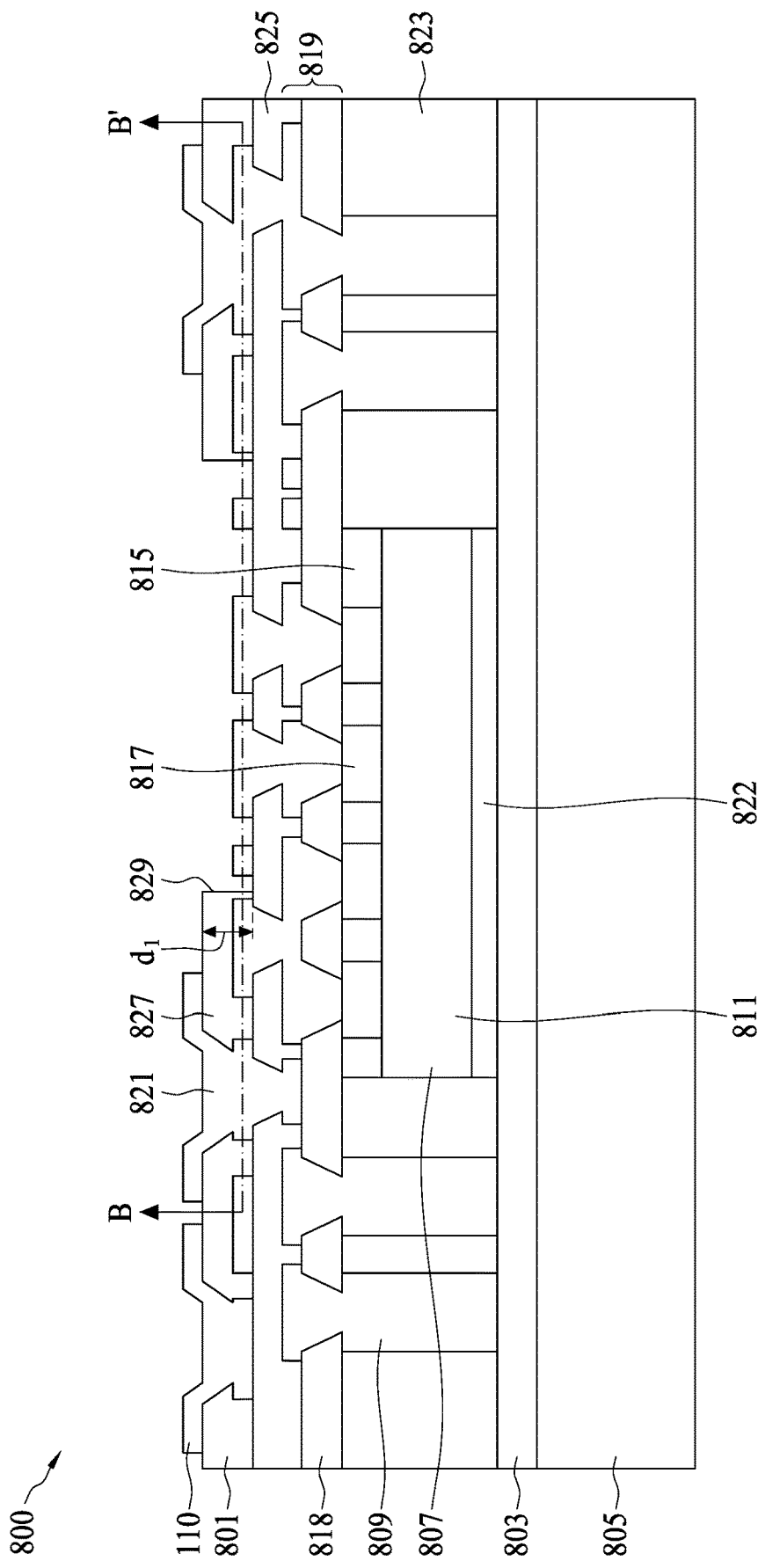

FIG. 8B illustrates a top down view of the structure of InFO package 800 along line B-B' in FIG. 8A. In this view, the surface device opening 829 is clearly illustrated as exposing portions of the second redistribution layer 821. Additionally in this view it is clear that the surface device opening 829 is formed to have dimensions that allow for the placement of the surface device 203 as well as the underfill material 205. For example, in an embodiment the surface device opening 829 may be formed to have a eighth length $L_8$ of between about 0.1 mm and about 1 mm, such as about 200 μm, and an eighth width $W_8$ of between about 0.1 mm and about 1 mm, such as about 200 μm. Additionally, the surface device opening 829 may be formed to a first depth $d_1$ of between about 0.5 μm and about 10 μm, such as about 5 μm, in order to expose the second redistribution layer 821.

Once the second openings 827 and the surface device opening 829 have been formed, the first external connection underbump metallizations 110 are formed to make electrical connections to the second redistribution layer 821 through the second openings 827. In an embodiment the first external connection underbump metallizations 110 are formed as described above with respect to FIG. 1. For example, the first external connection underbump metallizations 110 may be a single layer of conductive material, such as a layer of titanium, or a layer of nickel formed using CVD, PVD or the like. However, any suitable material or method of manufacture may be utilized.

Figure 9:
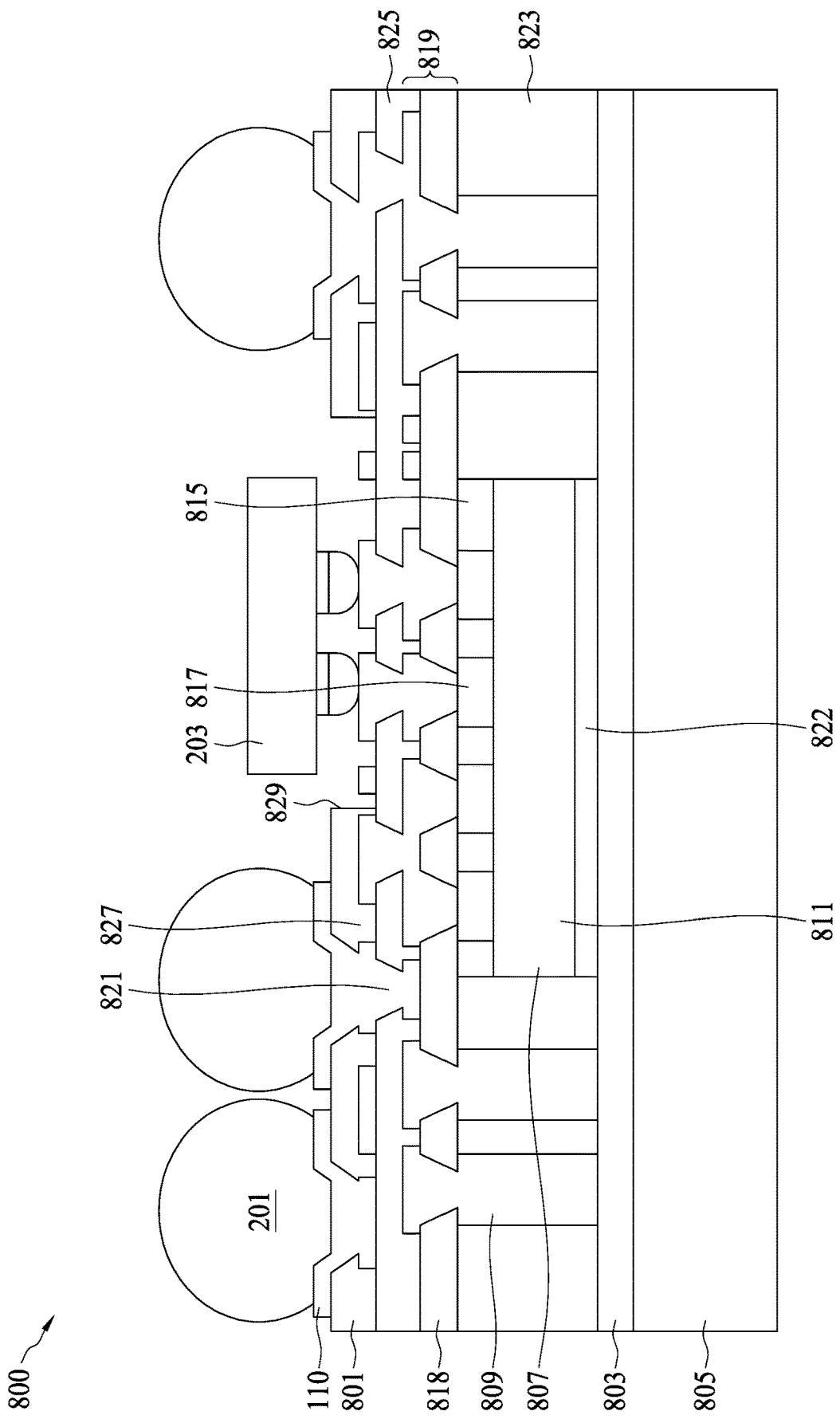
FIG. 9 illustrates a placement of a surface device in accordance with some embodiments.

FIG. 9 illustrates that, once the second openings 827 and the surface device opening 829 have been formed and the first external connection underbump metallizations 110 have been formed, the first surface device 203 (e.g., an IPD or SMD device) may be bonded to the second redistribution layer 821 through the surface device opening 829 formed through the second passivation layer 801. The first surface device 203 may be bonded to the second redistribution layer 821 as described above with respect to FIG. 2. For example, the first surface device 203 may be bonded through a joint formation/flux cleaning process, although any suitable process may be utilized.

Once the first surface device 203 has been bonded to the second redistribution layer 821, the first external connections 201 may be mounted or otherwise placed onto the first external connection underbump metallizations 110. In an embodiment the first external connections 201 may be mounted as described above with respect to FIG. 2. For example, a layer of tin may be initially formed and then reflowed in order to shape the first external connections 201 into a ball shape. However, any suitable materials or process may be utilized to place the first external connections 201 onto the first external connection underbump metallizations 110.

Figure 10:
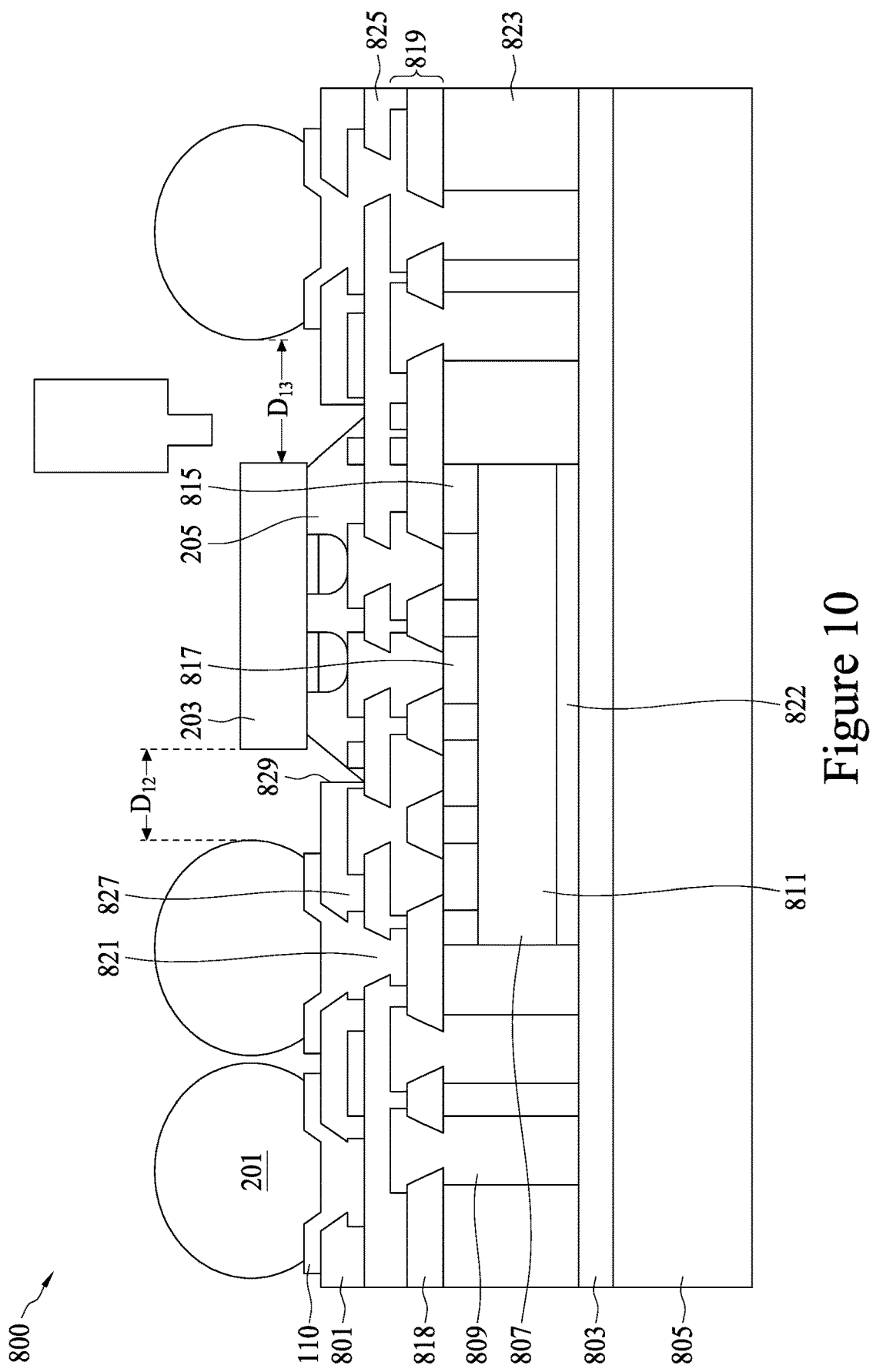
FIG. 10 illustrates a dispensing of underfill material in accordance with some embodiments.

FIG. 10 illustrates a dispensing of the underfill material 205 between the surface device 210 and the fifth passivation layer 825. In an embodiment the underfill material 205 is dispensed as described above with respect to FIG. 2, although any suitable process may be utilized. Additionally in this embodiment, the underfill material 205, in addition to simply protecting the connections for the first surface device 203, will also work to protect and isolate any of the second redistribution layer 821 that has been exposed by the formation of the surface device opening 829.

By forming the second passivation layer 801 and then forming the surface device opening 829 prior to the dispensing of the underfill material 205, the cavity of the surface device opening 829 formed within the second passivation layer 801 may be leveraged to prevent the underfill material 205 from bleeding to the adjacent first external connection underbump metallizations 110. Additionally in this embodiment, the underfill material 205 may be used to protect the exposed traces that were exposed during the patterning of the second passivation layer 801. All of this allows for a smaller keep off zone (KOZ) between the first surface device 203 and the first external connections 201 with no extra cost added. For example, the KOZ may be reduced to a twelfth distance $D_{12}$ of between about 50 μm and about 1000 μm, such as about 300 μm, on a first side of the first surface device 203 and a thirteenth distance $D_{13}$ of between about 50 μm and about 1000 μm, such as about 300 μm, on a second side of the first surface device 203. However, any suitable dimensions may be utilized.

Figure 11:
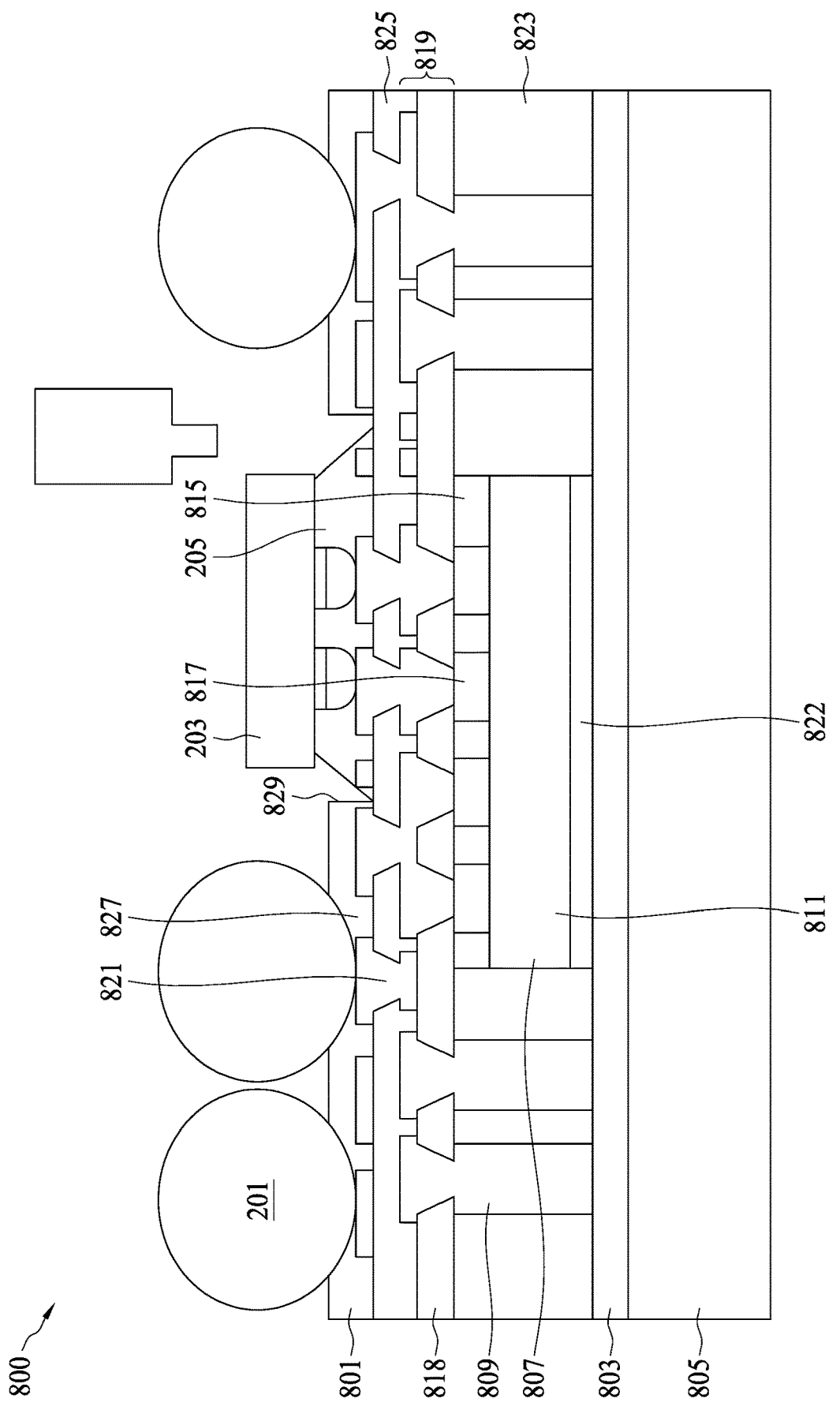
FIG. 11 illustrates an embodiment without an underbump metallization in accordance with some embodiments.

FIG. 11 illustrates another embodiment in which, instead of having the first external connection underbump metallizations 110 formed in electrical connection with the underlying first external connection underbump metallizations 110, the first external connection underbump metallizations 110 are omitted. As such, when the first external connections 201 are formed or placed in this embodiment, the first external connections 201 are placed in the second openings 827 formed through the second passivation layer 801 to make direct contact with the second redistribution layer 821. By omitting the step of forming the first external connection underbump metallizations 110, the overall process for manufacturing the InFO package 800 may be simplified and made more efficient.

In accordance with an embodiment, a method of manufacturing a semiconductor device comprising forming a first underbump metallization and a second underbump metallization over a substrate, wherein the first underbump metallization is adjacent to the second underbump metallization is provided. A first spacer is formed between the first underbump metallization and the second underbump metallization. A surface device is bonded to the first underbump metallization, wherein the surface device has a first surface facing the second underbump metallization, and an underfill is dispensed adjacent to the first surface, wherein the first spacer prevents the underfill from contacting the second underbump metallization.

In accordance with another embodiment, a method of manufacturing a semiconductor device the method comprising forming a redistribution layer over a semiconductor die, the redistribution layer comprising a first portion and a second portion is provided. A passivation layer is deposited over the redistribution layer, and the redistribution layer is patterned to form a first opening over the first portion and a second opening over the second opening. A first surface device is bonded to the second portion through the second opening. A first external connection is placed in electrical connection with the first portion through the first opening, and an underfill material is dispensed into the second opening and between the first surface device and the semiconductor die.

In accordance with yet another embodiment, a semiconductor device comprising a first underbump metallization separated from a second underbump metallization over a substrate is provided. A spacer is located between the first underbump metallization and the second underbump metallization, and an underfill material extending from the first underbump metallization to the spacer but not extending between the spacer and the second underbump metallization.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first surface device located within a first opening, wherein the first opening extends through passivation layer;
   an underfill material within the first opening, wherein the underfill material extends below a topmost surface of the passivation layer; and
   an external connector extending through the passivation layer to make physical contact with a first portion of a redistribution layer, a second portion of the redistribution layer being in electrical contact with the first surface device, the external connector is separated from the first opening by the passivation layer.

2. The semiconductor device of claim 1, wherein the first surface device is separated from the external connector by a distance of between about 50 μm and about 1000 μm.

3. The semiconductor device of claim 2, wherein the first surface device is separated from the external connector by a distance of between about 50 μm and about 300 μm.

4. The semiconductor device of claim 2, further comprising a second external connector extending through the passivation layer, wherein the second external connector is separated from the first surface device by a distance of between about 50 μm and about 1000 μm.

5. The semiconductor device of claim 4, wherein the second external connector is separated from the first surface device by a distance of between about 50 μm and about 300 μm.

6. The semiconductor device of claim 1, wherein the underfill material extends out of the first opening.

7. The semiconductor device of claim 1, wherein the external connector comprises:
   an underbump metallurgy (UBM) extending through the passivation layer; and
   a solder region on the UBM.

8. The semiconductor device of claim 1, wherein the external connector comprises a solder region extending through the passivation layer to the first portion of the redistribution layer.

9. The semiconductor device of claim 1, wherein a sidewall of the underfill material extends between a sidewall of the first opening and a sidewall of the redistribution layer.

10. A package comprising:
    a semiconductor die encapsulated in a molding compound;
    a redistribution structure over the semiconductor die and the molding compound, wherein the redistribution structure comprises:
       a redistribution line; and
       a passivation layer covering a first portion of the redistribution line and exposing a second portion of the redistribution line;
    an external connector extending through the passivation layer to the first portion of the redistribution line;
    a surface device directly bonded to the second portion of the redistribution line; and
    an underfill between the redistribution structure and the surface device, wherein the underfill extends below a top surface of the passivation layer.

11. The package of claim 10, wherein the underfill covers a top surface of the second portion of the redistribution line.

12. The package of claim 10, wherein the underfill contacts a sidewall of the passivation layer.

13. The package of claim 12, wherein the sidewall of the passivation layer surrounds the underfill in a top down view.

14. The package of claim 12, wherein the sidewall of the passivation layer separates external connector from the underfill.

15. The package of claim 10, further comprising a through via extending through the molding compound adjacent the semiconductor die.

16. The package of claim 10, wherein the surface device is a passive device.

17. A package comprising:
    a die encapsulated in a molding compound:
    a redistribution line over and electrically connected to the die;
    a passivation layer partially covering the redistribution line;
    a passive device bonded to the redistribution line; and
    an underfill between the redistribution line and the passive device, wherein the underfill extends below a topmost surface of the passivation layer, and wherein a sidewall of the passivation layer surrounds the underfill in a top down view.

18. The package of claim 17 further comprising an external connector extending through the passivation layer to the redistribution line, wherein the passivation layer separates the external connector from the underfill.

19. The package of claim 17, wherein the underfill contacts the sidewall of the passivation layer.

20. The package of claim 17, wherein the underfill contacts a top surface of the redistribution line.

* * * * *